US009886150B2

(12) United States Patent
Yamamoto et al.

(10) Patent No.: US 9,886,150 B2
(45) Date of Patent: Feb. 6, 2018

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Roh Yamamoto, Kanagawa (JP); Hideki Uochi, Kangawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 112 days.

(21) Appl. No.: 14/844,344

(22) Filed: Sep. 3, 2015

(65) Prior Publication Data

US 2016/0070386 A1 Mar. 10, 2016

(30) Foreign Application Priority Data

Sep. 5, 2014 (JP) ................................. 2014-180856
Sep. 19, 2014 (JP) ................................. 2014-190964

(51) Int. Cl.
*G06F 3/044* (2006.01)
*G09G 3/36* (2006.01)
*G09G 3/20* (2006.01)

(52) U.S. Cl.
CPC ........... *G06F 3/044* (2013.01); *G09G 3/2096* (2013.01); *G09G 3/36* (2013.01);
(Continued)

(58) Field of Classification Search
CPC ........ G06F 3/044; G09G 3/2096; G09G 3/36; G09G 2330/021; G09G 2370/08;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Andrew Sasinowski
(74) *Attorney, Agent, or Firm* — Fish & Richardson P.C.

(57) ABSTRACT

A display device with less power consumption. The display device operates in a still image display period and a moving image display period, and includes a receiving circuit having a function of receiving an image signal, a driver circuit having a function of driving a display portion, and the display portion having a function of displaying an image. The display portion displays an image at a frame frequency of less than or equal to 1 Hz in the still image display period. The receiving circuit stops receiving an image signal in the still image display period. Switching from the still image display period to the moving image display period is accurately performed by an external signal.

14 Claims, 27 Drawing Sheets

(52) U.S. Cl.
CPC ........... *G09G 2300/0426* (2013.01); *G09G 2300/0452* (2013.01); *G09G 2300/0809* (2013.01); *G09G 2300/0842* (2013.01); *G09G 2310/0291* (2013.01); *G09G 2310/08* (2013.01); *G09G 2320/0613* (2013.01); *G09G 2320/103* (2013.01); *G09G 2330/021* (2013.01); *G09G 2370/08* (2013.01); *G09G 2370/14* (2013.01)

(58) Field of Classification Search
CPC ....... G09G 2370/14; G09G 2300/0426; G09G 2300/0452; G09G 2320/103; G09G 2320/0613; G09G 2300/0842; G09G 2310/0291; G09G 2300/0809
See application file for complete search history.

(56) References Cited

U.S. PATENT DOCUMENTS

| Patent/Publication | Date | Inventor |
|---|---|---|
| 6,294,274 B1 | 9/2001 | Kawazoe et al. |
| 6,353,334 B1 | 3/2002 | Schultz et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0152934 A1* | 7/2007 | Maeda ............... G09G 3/3233 345/92 |
| 2007/0172591 A1 | 7/2007 | Seo et al. |
| 2007/0176919 A1* | 8/2007 | Yamashita ............ G09G 5/006 345/214 |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0011958 A1* | 1/2008 | Endo ................. A61B 6/4488 250/370.08 |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0009510 A1* | 1/2009 | Shu ..................... G09G 3/3688 345/215 |
| 2009/0068773 A1 | 3/2009 | Lai et al. |
| 2009/0073325 A1 | 3/2009 | Kuwabara et al. |
| 2009/0109142 A1* | 4/2009 | Takahara ............... G09G 3/006 345/76 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0149138 A1 | 6/2010 | Lee et al. |
| 2011/0090183 A1 | 4/2011 | Yamazaki et al. |
| 2011/0090204 A1 | 4/2011 | Yamazaki et al. |
| 2011/0102696 A1 | 5/2011 | Yamazaki et al. |
| 2011/0115839 A1 | 5/2011 | Takahashi et al. |
| 2011/0128461 A1 | 6/2011 | Koyama et al. |
| 2011/0134350 A1* | 6/2011 | Yamazaki ............ G02F 1/1368 349/43 |
| 2011/0148826 A1 | 6/2011 | Koyama et al. |
| 2011/0148846 A1 | 6/2011 | Arasawa et al. |
| 2011/0149185 A1 | 6/2011 | Yamazaki |
| 2011/0157131 A1 | 6/2011 | Miyake |
| 2011/0175833 A1 | 7/2011 | Kurokawa et al. |
| 2011/0175874 A1 | 7/2011 | Wakimoto et al. |
| 2011/0175894 A1 | 7/2011 | Wakimoto et al. |
| 2011/0175895 A1 | 7/2011 | Hayakawa et al. |
| 2011/0181560 A1 | 7/2011 | Yamazaki |
| 2011/0193836 A1 | 8/2011 | Umezaki |
| 2011/0199404 A1 | 8/2011 | Umezaki et al. |
| 2011/0205254 A1 | 8/2011 | Umezaki et al. |
| 2011/0210957 A1 | 9/2011 | Koyama et al. |
| 2011/0216023 A1 | 9/2011 | Kurokawa et al. |
| 2011/0216043 A1 | 9/2011 | Tamura et al. |
| 2011/0216048 A1 | 9/2011 | Koyama et al. |
| 2011/0267297 A1 | 11/2011 | Yamazaki et al. |
| 2011/0267330 A1 | 11/2011 | Yamazaki et al. |
| 2011/0267331 A1 | 11/2011 | Yamazaki et al. |
| 2011/0267381 A1 | 11/2011 | Yamazaki et al. |
| 2011/0279356 A1 | 11/2011 | Takemura |

(56) References Cited

U.S. PATENT DOCUMENTS

| | | | |
|---|---|---|---|
| 2011/0279419 A1 | 11/2011 | Takemura | |
| 2011/0285372 A1 | 11/2011 | Takahashi et al. | |
| 2011/0285426 A1 | 11/2011 | Takahashi et al. | |
| 2012/0001874 A1 | 1/2012 | Kurokawa et al. | |
| 2012/0001954 A1 | 1/2012 | Yamazaki et al. | |
| 2012/0002127 A1 | 1/2012 | Yamazaki et al. | |
| 2012/0032942 A1 | 2/2012 | Toyotaka et al. | |
| 2012/0033151 A1 | 2/2012 | Toyotaka et al. | |
| 2012/0038618 A1* | 2/2012 | Koyama | G09G 3/3688 345/212 |
| 2012/0062811 A1 | 3/2012 | Miyake | |
| 2012/0273773 A1 | 11/2012 | Ieda et al. | |
| 2012/0293202 A1 | 11/2012 | Nishijima et al. | |
| 2012/0293209 A1 | 11/2012 | Takewaki | |
| 2012/0319107 A1 | 12/2012 | Miyake | |
| 2013/0134416 A1 | 5/2013 | Mishima et al. | |
| 2013/0235689 A1 | 9/2013 | Koyama | |
| 2014/0231799 A1* | 8/2014 | Matsubayashi | H01L 27/0629 257/43 |
| 2014/0267206 A1* | 9/2014 | Takani | G09G 3/3688 345/209 |
| 2015/0138086 A1* | 5/2015 | Underkoffler | G06F 3/017 345/158 |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2011-237760 | 11/2011 | |
| WO | WO-2004/114391 | 12/2004 | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back. Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 13, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paperifast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, Or Al; B: Mg, Mn, Fe, Ni, Cu,or Zn] at Temperatures Over 1000° C", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUs on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW'08 : Proceedings of the 6th International Display Workshops, Dec. 3, 2008, pp. 581-584.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis if IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

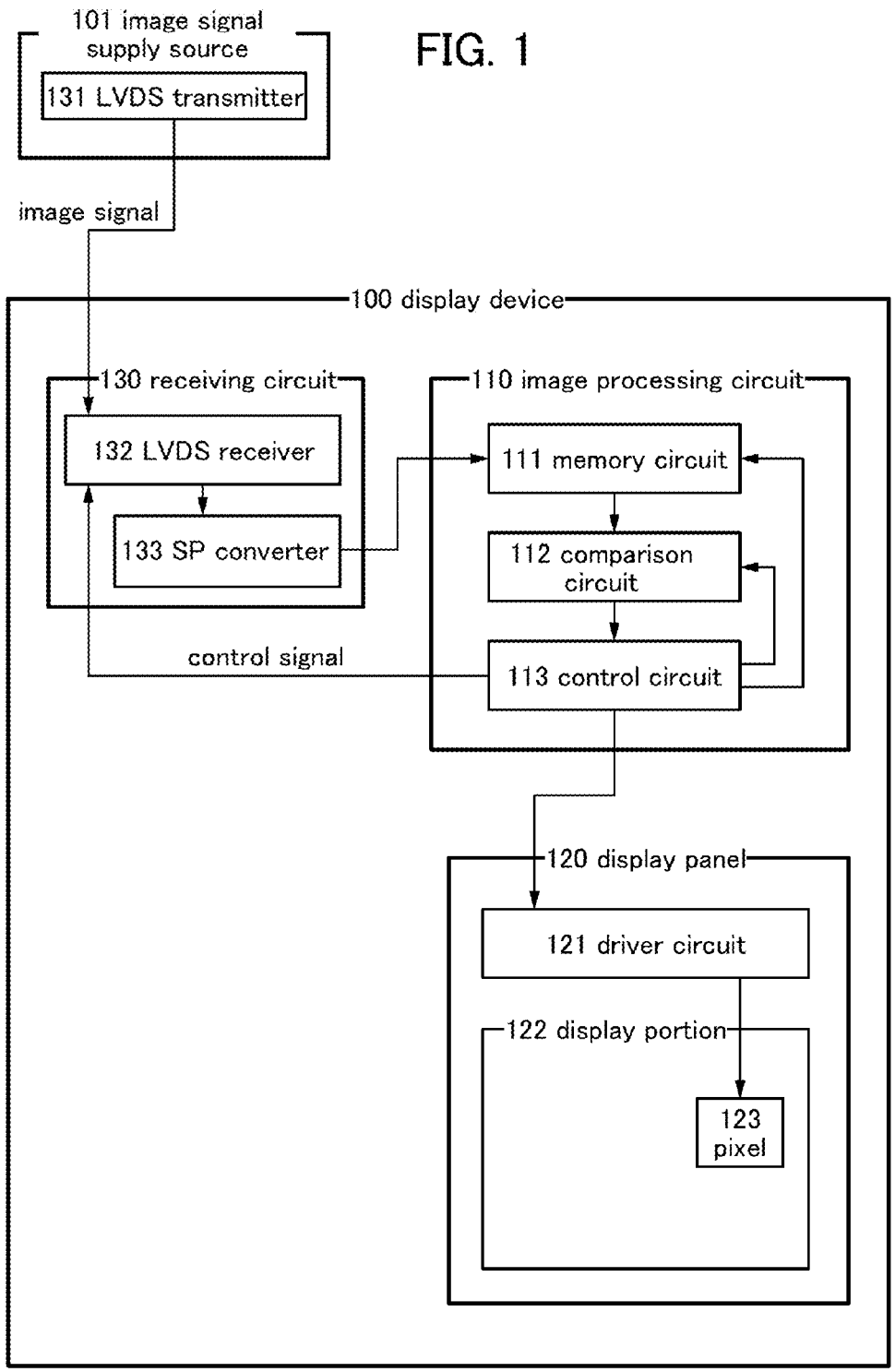

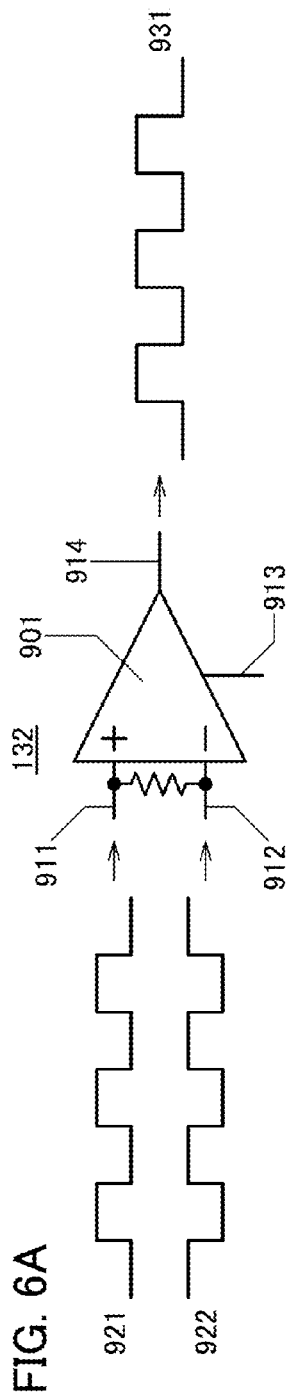
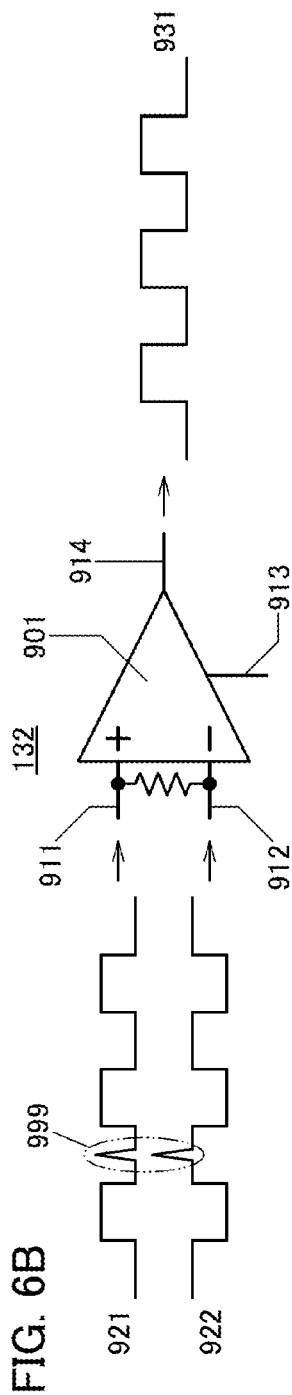
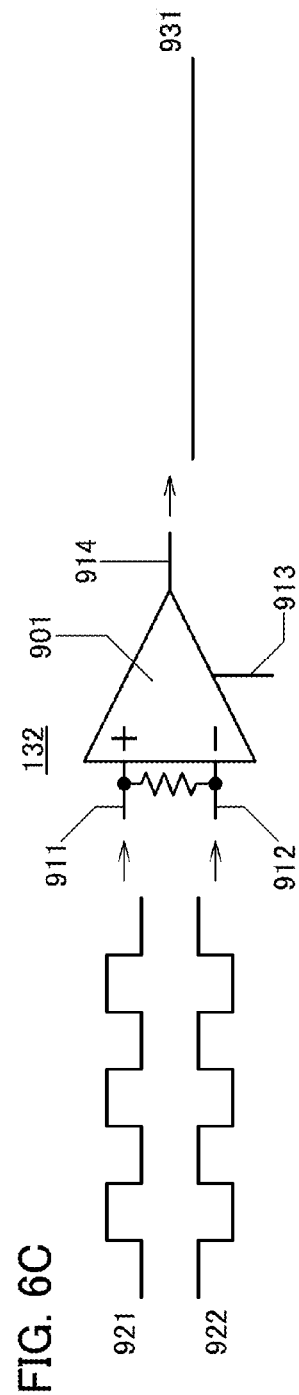

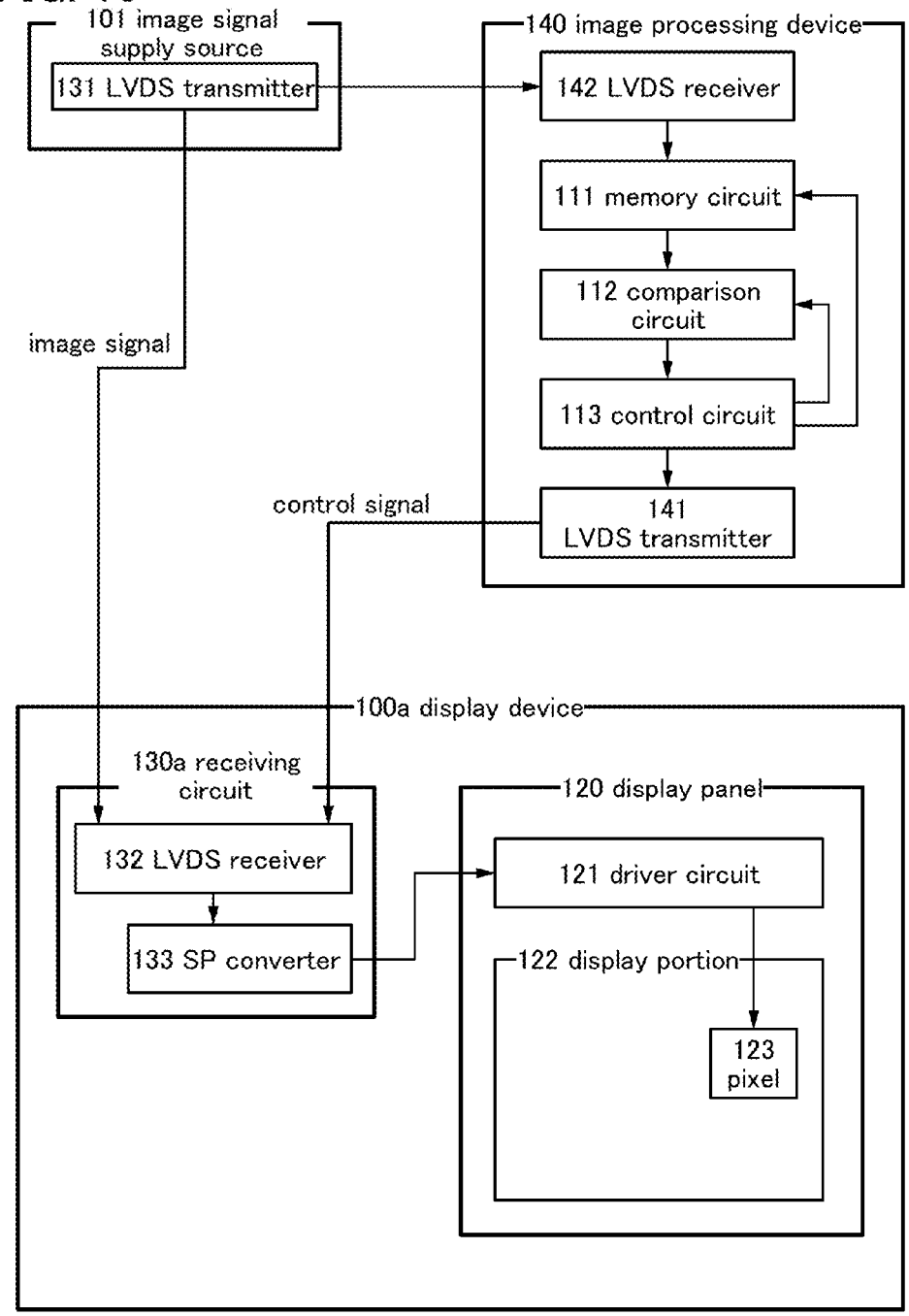

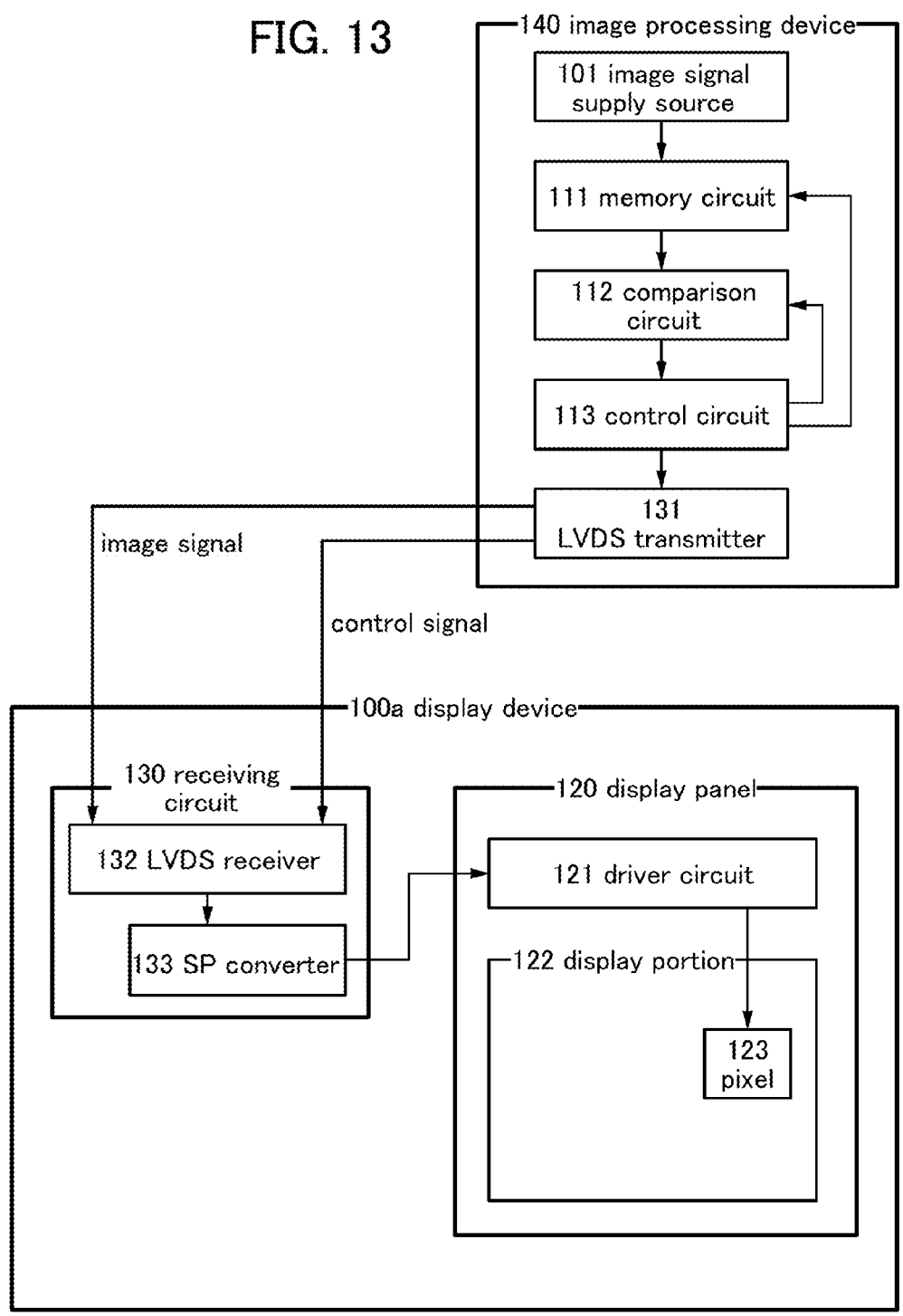

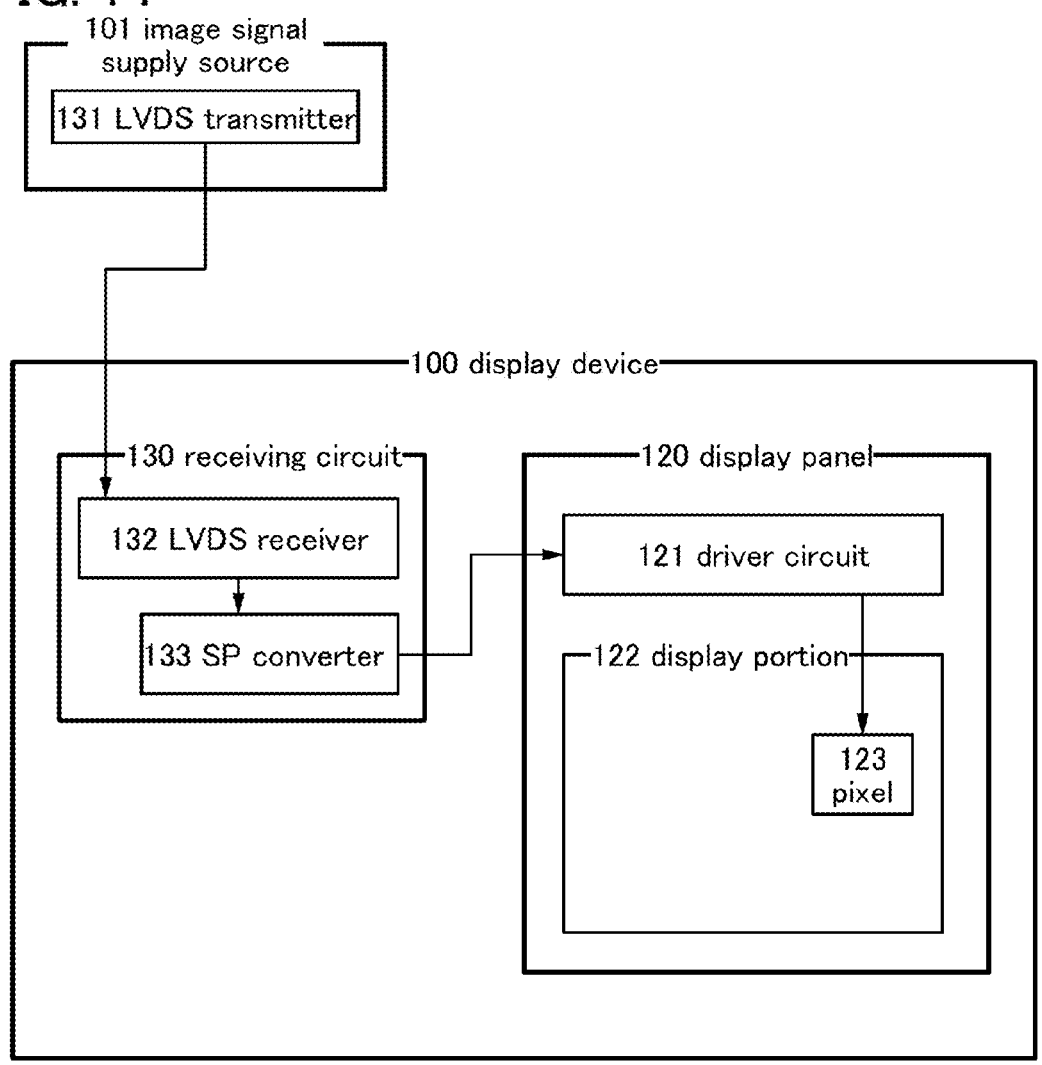

FIG. 15A1
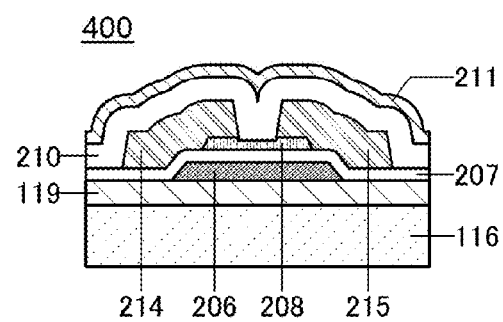
FIG. 15A2
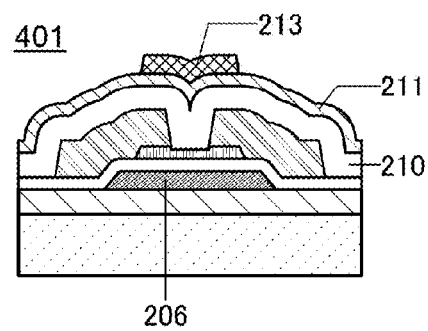
FIG. 15B1
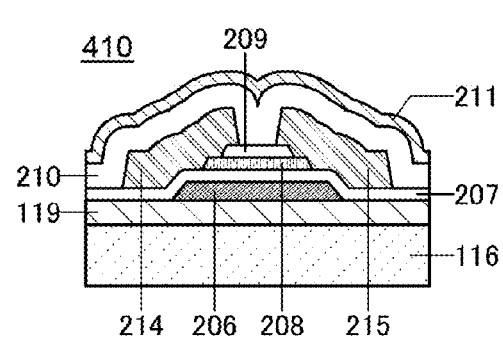
FIG. 15B2
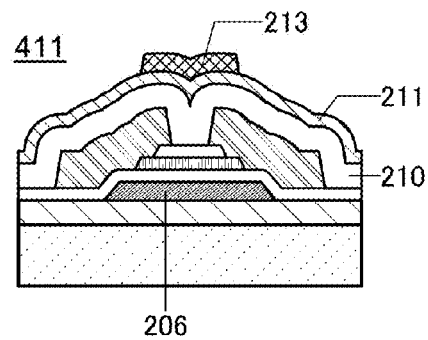
FIG. 15C1
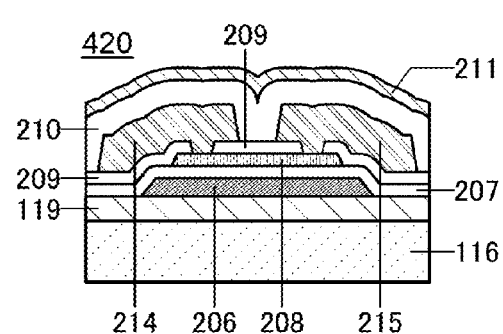
FIG. 15C2
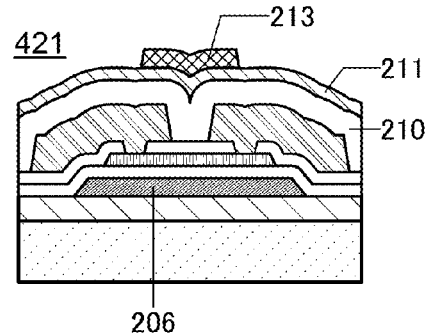

FIG. 16A1
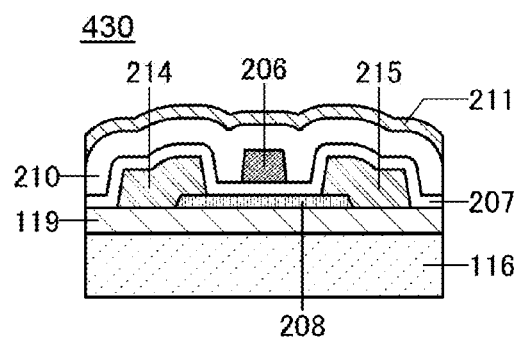
FIG. 16A2
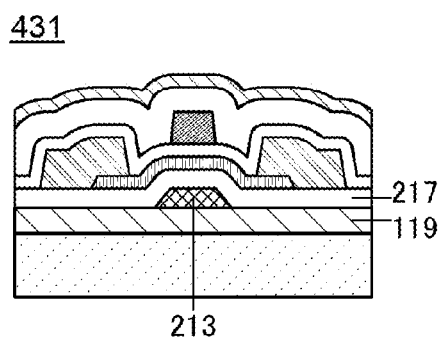
FIG. 16A3
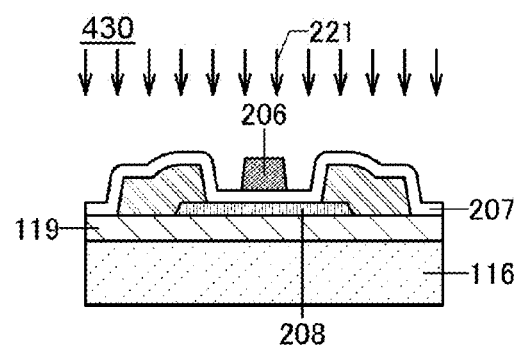
FIG. 16B1
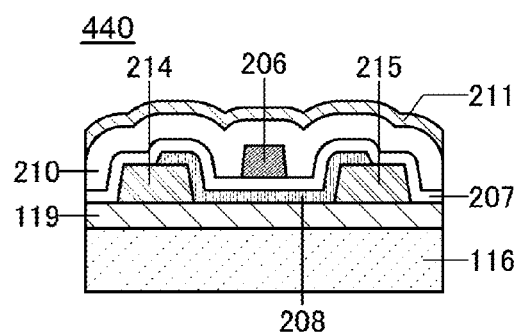
FIG. 16B2
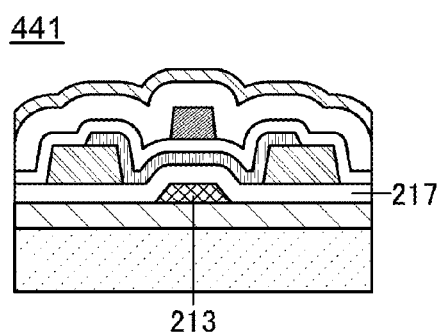

451

451

451

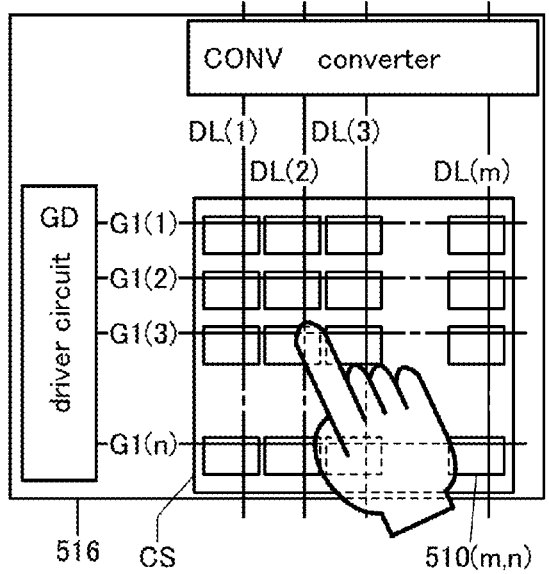
FIG. 19A
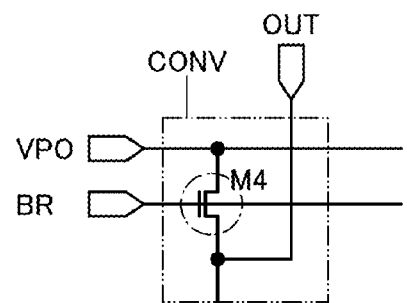
FIG. 19B
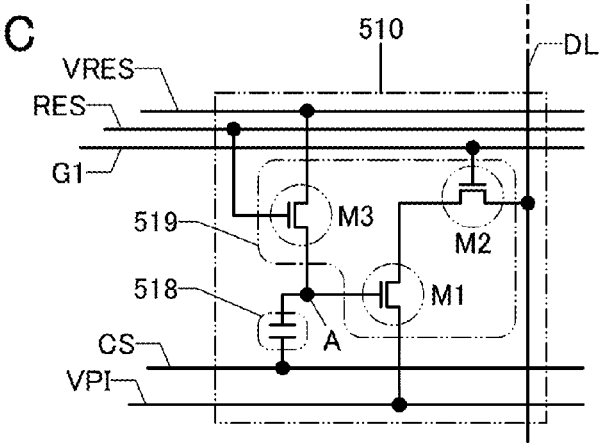
FIG. 19C
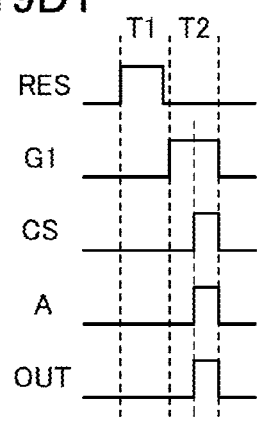
FIG. 19D1
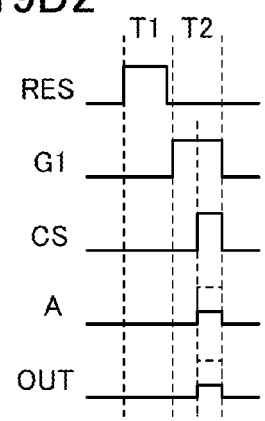
FIG. 19D2

50 nm 3 nm 0.8 nm 3 nm

FIG. 24A
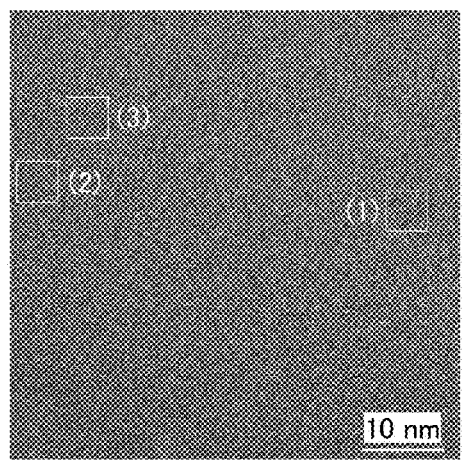
FIG. 24B  FIG. 24C  FIG. 24D
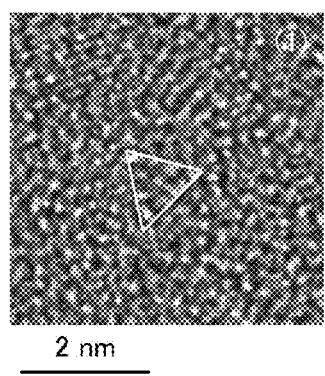 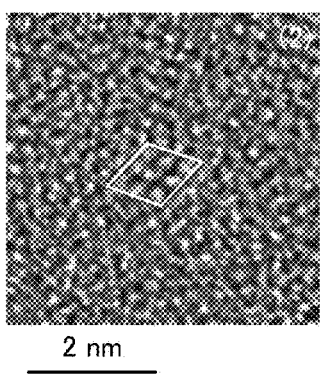 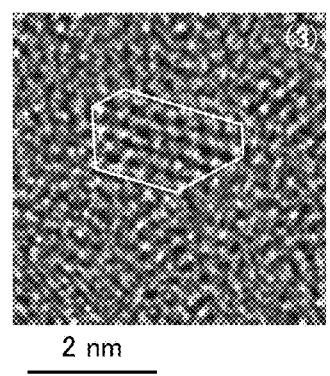

FIG. 26A
FIG. 26B
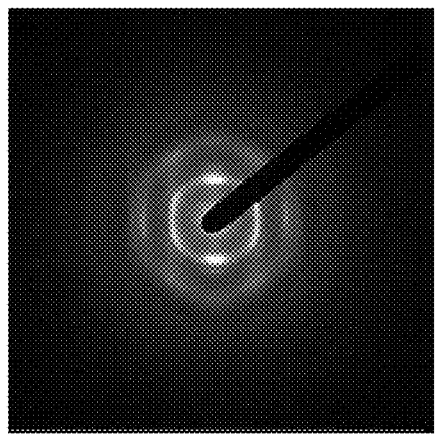
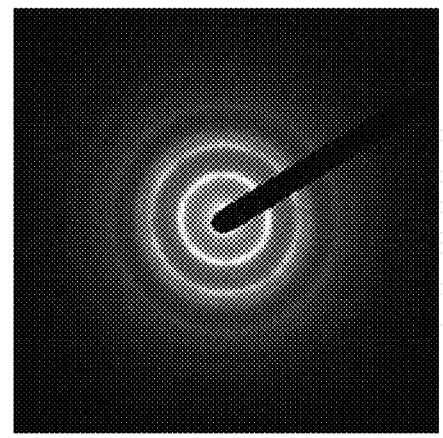

DISPLAY DEVICE AND ELECTRONIC DEVICE

BACKGROUND OF THE INVENTION

1. Field of the Invention

One embodiment of the present invention relates to a display device. One embodiment of the present invention also relates to a method for driving the display device.

Note that one embodiment of the present invention is not limited to the above technical field. For example, one embodiment of the present invention relates to an object, a method, or a manufacturing method. One embodiment of the present invention relates to a process, a machine, manufacture, or a composition of matter.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an imaging device, an electronic device, and the like may include a semiconductor element or a semiconductor circuit. Therefore, a display device, a light-emitting device, a lighting device, an electro-optical device, an imaging device, an electronic device, and the like include a semiconductor device in some cases.

2. Description of the Related Art

In recent years, definition of a display device has been increased. An increase in definition of a display device increases the number of wirings for transmitting an image signal to the display device, power consumption, or the like in many cases. In addition, the high-definition display device is likely to be influenced by noise, for example, electromagnetic interference (EMI), which often reduces display quality.

For this reason, low-voltage differential signaling (LVDS) defined by the TIA/EIA644 standard (telecommunications industry association (TIA), electronic industries alliance (ETA)) is often employed as a means for transmitting a signal to a display device. LVDS is a communication technology that enables relatively high-speed operation and reduces power consumption due to a small amplitude signal, the number of wirings, and noises.

In addition, a technology for reducing power consumption of a display device by which the number of operations of writing the same image signal (also referred to as refresh operations) is reduced in the case where the same image (a still image) is continuously displayed is known (Patent Document 1). The frequency of refresh operations is referred to as a refresh rate.

REFERENCE

Patent Document

[Patent Document 1] Japanese Published Patent Application No. 2011-237760

SUMMARY OF THE INVENTION

LVDS can remove noises using differential amplification with an operational amplifier, and thus can suppress a reduction in display quality. However, a bias current needs to be constantly applied to an operational amplifier, so that a reduction in power consumption is difficult. Therefore, when LVDS is employed for the display device disclosed in Patent Document 1, it is difficult to achieve a further reduction in power consumption of the display device.

An object of one embodiment of the present invention is to provide a display device, electronic device, or the like with low power consumption. Another object of one embodiment of the present invention is to provide a method for driving a display device, electronic device, or the like with low power consumption. Another object of one embodiment of the present invention is to provide a display device with high design flexibility and a method for manufacturing the display device.

Another object of one embodiment of the present invention is to provide a display device, electronic device, or the like having high visibility. Another object of one embodiment of the present invention is to provide a display device, electronic device, or the like having high display quality. Another object of one embodiment of the present invention is to provide a display device, electronic device, or the like having high reliability. Another object of one embodiment of the present invention is to provide a display device, electronic device, or the like with high productivity. Another object of one embodiment of the present invention is to provide a novel display device, electronic device, or the like.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a display device including a receiving circuit, a driver circuit, and a display portion. The receiving circuit has a function of receiving an image signal. The driver circuit has a function of supplying the image signal to the display portion. The display portion has a function of displaying an image at a frame frequency of less than or equal to 1 Hz in a still image display period. The receiving circuit has a function of making at least part of the receiving circuit stop operating in the still image display period.

The receiving circuit includes an operational amplifier and has a function of stopping supply of a bias current to the operational amplifier in the still image display period. The driver circuit has a function of stopping operation in the still image display period. The display device has a function of stopping supply of a clock signal to the driver circuit in the still image display period.

One embodiment of the present invention is a display device including a first circuit and a display portion. The first circuit can receive an image signal and supply the image signal to the display portion. The display portion can display a still image based on the image signal in a first period, and display a moving image based on the image signal in a second period. The display portion can display an image at a frame frequency of less than or equal to 1 Hz in the first period. The first circuit can stop at least part of its operation in the first period.

The first period and the second period can be switched by a control signal.

The first circuit includes an operational amplifier. The first circuit can stop supply of a bias current to the operational amplifier in the first period.

Note that the display device of one embodiment of the present invention can display an image at a frame frequency of less than or equal to 0.2 Hz in the first period.

With one embodiment of the present invention, a display device, electronic device, or the like with low power consumption can be provided. With another embodiment of the present invention, a method for driving a display device, electronic device, or the like with low power consumption can be provided. With another embodiment of the present invention, a display device with high design flexibility and a method for manufacturing the display device can be provided.

One embodiment of the present invention provides a display device, electronic device, or the like having high visibility. One embodiment of the present invention provides a display device, electronic device, or the like having high display quality. One embodiment of the present invention provides a display device, electronic device, or the like having high reliability. One embodiment of the present invention provides a display device, electronic device, or the like with high productivity. One embodiment of the present invention provides a novel display device, electronic device, or the like.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIG. 1 is a block diagram illustrating one embodiment of a display device.

FIGS. 6A to 6C illustrate operations of an LVDS receiver.

FIG. 10 is a block diagram illustrating one embodiment of a display device.

FIG. 13 is a block diagram illustrating one embodiment of a display device.

FIG. 14 is a block diagram illustrating one embodiment of a display device.

FIGS. 15A1, 15A2, 15B1, 15B2, 15C1, and 15C2 are cross-sectional views illustrating embodiments of transistors.

FIGS. 16A1, 16A2, 16A3, 16B1, and 16B2 are cross-sectional views illustrating embodiments of transistors.

FIGS. 19A, 19B, 19C, 19D1, and 19D2 illustrate a structure example of a touch sensor and an example of a method for driving the touch sensor.

FIGS. 24A to 24D are Cs-corrected high-resolution TEM images of a plane of a CAAC-OS.

FIGS. 26A and 26B show electron diffraction patterns of a CAAC-OS.

DETAILED DESCRIPTION OF THE INVENTION

Figure 2A:
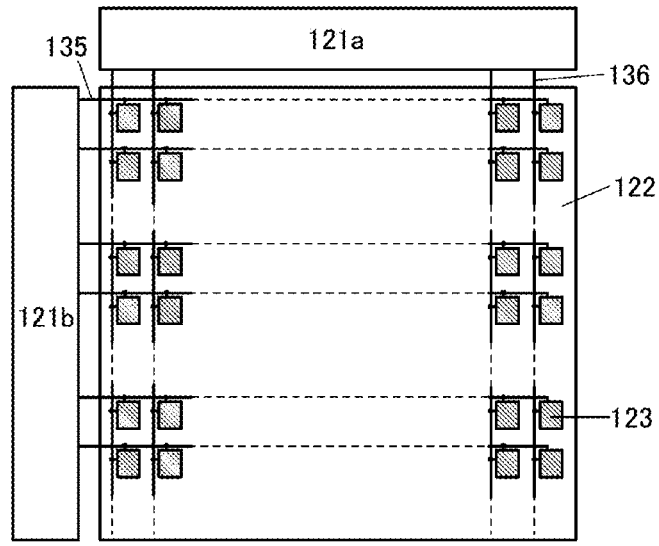
FIGS. 2A to 2C are a block diagram and circuit diagrams illustrating one embodiment of a display device.

Embodiments will be described in detail with reference to the accompanying drawings. Note that the present invention is not limited to the description below, and it is understood easily by those skilled in the art that various changes and modifications can be made without departing from the spirit and scope of the present invention.

Therefore, the present invention should not be construed as being limited to the description in the following embodiments. In the structures of the present invention to be described below, the same portions or portions having similar functions are denoted by the same reference numerals in different drawings, and explanation thereof will not be repeated.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like. For example, in the actual manufacturing process, a resist mask or the like might be unintentionally reduced in size by treatment such as etching, which might not be illustrated for easy understanding.

Especially in a top view (also referred to as a plan view), a perspective view, or the like, some components might not be illustrated for easy understanding.

In this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "perpendicular" indicates that the angle formed between two straight lines is greater than or equal to 80° and less than or equal to 100°, and accordingly also includes the case where the angle is greater than or equal to 85° and less than or equal to 95°.

In the specification and the like, the terms "identical", "the same", "equal", "uniform", and the like used in describing calculation values and actual measurement values allow for a margin of error of ±20% unless otherwise specified.

In this specification, in the case where an etching step is performed after a lithography process, a resist mask formed in the lithography process is removed after the etching step, unless otherwise specified.

A voltage usually refers to a potential difference between a given potential and a reference potential (e.g., a source potential or a ground potential (a GND potential)). A voltage can be referred to as a potential and vice versa.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Moreover, a term with an ordinal number in this specification and the like might not be provided with any ordinal number in a claim.

The channel length refers to, for example, a distance, observed in a top view of a transistor, between a source (a source region or a source electrode) and a drain (a drain region or a drain electrode) in a region where a semiconductor and a gate electrode overlap with each other, a portion where a current flows in a semiconductor when the transistor is on, or a region where a channel is formed. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

Note that in this specification and the like, an "on state" of a transistor refers to a state in which a source and a drain of the transistor are electrically short-circuited. Furthermore, an "off state" of the transistor refers to a state in which the source and the drain of the transistor are electrically disconnected.

In this specification and the like, in some cases, "on-state current" means a current which flows between a source and a drain when a transistor is on, and "off-state current" means a current which flows between a source and a drain when a transistor is off.

The off-state current of a transistor depends on a voltage between a gate and a source (also referred to as Vgs) in some cases. Thus, "the off-state current of a transistor is lower than or equal to I" means "there is Vgs with which the off-state current of the transistor becomes lower than or equal to I" in some cases. The off-state current of a transistor may refer to a current at a certain Vgs or a current at Vgs in a certain voltage range.

As an example, the assumption is made of an n-channel transistor where the threshold voltage Vth is 0.5 V and the current flowing between a source and a drain (hereinafter also referred to as Ids) is $1 \times 10^{-9}$ A at Vgs of 0.5 V, $1 \times 10^{-13}$ A at Vgs of 0.1 V, $1 \times 10^{-19}$ A at Vgs of −0.5 V, and $1 \times 10^{-22}$ A at Vgs of −0.8 V. The Ids of the transistor is $1 \times 10^{-19}$ A or lower at Vgs of −0.5 V or at Vgs in the range of −0.8 V to −0.5 V; therefore, it can be said that the off-state current of the transistor is $1 \times 10^{-19}$ A or lower. Since there is Vgs at which the drain current of the transistor is $1 \times 10^{-22}$ A or lower, it can be said that the off-state current of the transistor is $1 \times 10^{-22}$ A or lower.

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage between its drain and source (hereinafter also referred to as Vds) in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like.

The channel width refers to, for example, the length of a portion where a source and a drain face each other in a region where a semiconductor and a gate electrode overlap with each other, a portion where a current flows in a semiconductor when a transistor is on, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is higher than the proportion of a channel region formed in a top surface of a semiconductor in some cases. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

(Embodiment 1)

A display device of one embodiment of the present invention will be described with reference to the drawings.

<Configuration Example of Display Device>

FIG. 1 is a block diagram illustrating a structure of a display device 100 described in this embodiment. The display device 100 includes an image processing circuit 110, a display panel 120, and a receiving circuit 130.

The image processing circuit 110 includes a memory circuit 111, a comparison circuit 112, and a control circuit 113. The display panel 120 includes a driver circuit 121 and a display portion 122. The display portion 122 includes a pixel 123. The receiving circuit 130 includes an LVDS receiver 132 and a serial-parallel converter (hereinafter also referred to as an SP converter) 133.

FIG. 2A is a block diagram illustrating a configuration of the display panel 120. The driver circuit 121 includes a driver circuit 121a and a driver circuit 121b. For example, the driver circuit 121a functions as a signal line driver circuit, and the driver circuit 121b functions as a scan line driver circuit.

The display panel 120 includes m scan lines 135 which are arranged parallel or substantially parallel to each other and whose potentials are controlled by the driver circuit 121b, and n signal lines 136 which are arranged parallel or substantially parallel to each other and whose potentials are controlled by the driver circuit 121a. The display portion 122 includes a plurality of pixels 123 arranged in a matrix.

Each of the scan lines 135 is electrically connected to the n pixels 123 in the corresponding row among the pixels 123 arranged in m rows and n columns in the display portion 122. Each of the signal lines 136 is electrically connected to the m pixels 123 in the corresponding column among the pixels 123 arranged in m rows and n columns Note that m and n are each an integer of 1 or more.

Figure 3A:
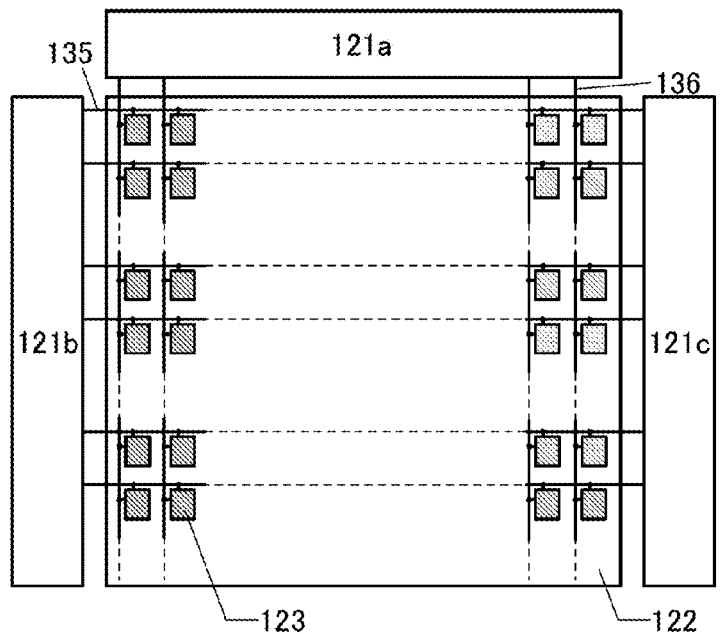
FIGS. 3A and 3B are block diagrams illustrating embodiments of a display device.
Figure 3B:
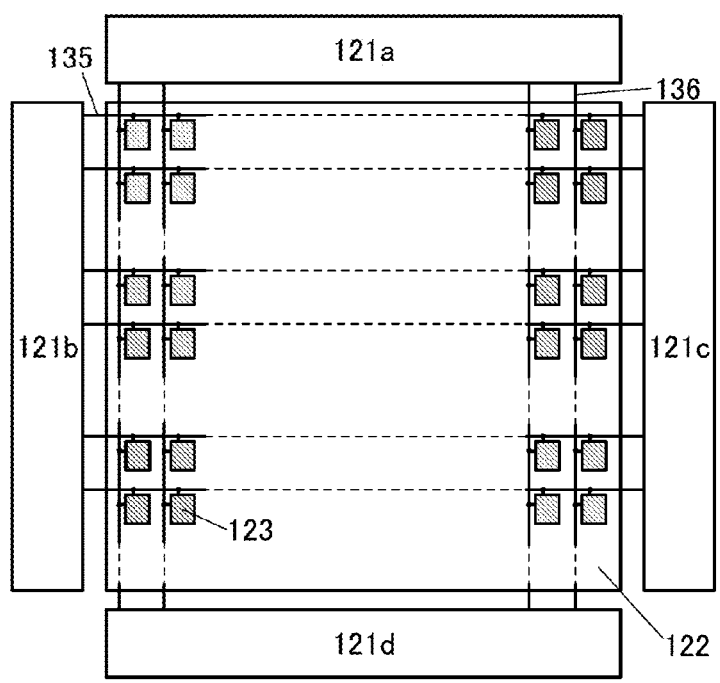

As illustrated in FIG. 3A, a driver circuit 121c may be provided on the opposite side of the display portion 122 from the driver circuit 121b. Furthermore, as illustrated in FIG. 3B, a driver circuit 121d may be provided on the opposite side of the display portion 122 from the driver circuit 121a. FIGS. 3A and 3B each illustrate an example in which each scan line 135 is connected to the driver circuit 121b and the driver circuit 121c. However, the connection relation is not limited to this. For example, each scan line 135 may be connected to one of the driver circuit 121b and the driver circuit 121c. FIG. 3B illustrates an example in which each signal line 136 is connected to the driver circuit 121a and the driver circuit 121d. However, the connection relation is not limited to this. For example, each signal line 136 may be connected to one of the driver circuit 121a and the driver circuit 121d. The driver circuits 121a, 121b, 121c, and 121d may have a function other than the function of driving the pixel 123.

Figure 2B:
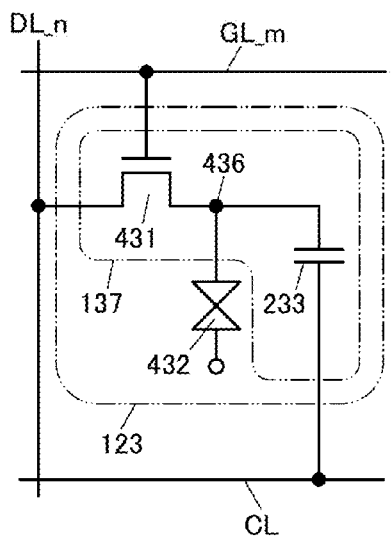
Figure 2C:
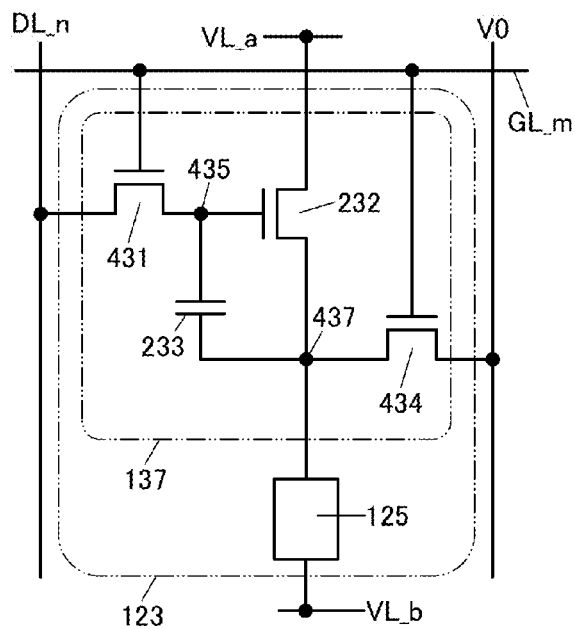

FIGS. 2B and 2C illustrate examples of a circuit configuration that can be used for the pixels 123 in the display panel illustrated in FIG. 2A.

The pixel circuit 137 illustrated in FIG. 2B includes the transistor 431 and the capacitor 233. The pixel circuit 137 is electrically connected to a liquid crystal element 432 that can function as a display element.

The potential of one of a pair of electrodes of the liquid crystal element 432 is set according to the specifications of the pixel circuits 137 as appropriate. The alignment state of the liquid crystal element 432 depends on data written to a node 436. A common potential may be applied to one of the pair of electrodes of the liquid crystal element 432 included in each of the plurality of pixels 123. Further, the potential supplied to one of a pair of electrodes of the liquid crystal element 432 in the pixel 123 in one row may be different from the potential supplied to one of a pair of electrodes of the liquid crystal element 432 in the pixel 123 in another row.

As examples of a driving method of the display device including the liquid crystal element 432, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

The liquid crystal element 432 may be formed using a liquid crystal composition including liquid crystal exhibiting a blue phase and a chiral material. The liquid crystal exhibiting a blue phase has a short response time of 1 msec or less. Since the liquid crystal exhibiting a blue phase is optically isotropic, alignment treatment is not necessary and viewing angle dependence is small.

In the pixel circuit 137 in the m-th row and the n-th column, one of a source electrode and a drain electrode of the transistor 431 is electrically connected to a signal line DL_n, and the other is electrically connected to the node 436. A gate electrode of the transistor 431 is electrically connected to a scan line GL_m. The transistor 431 has a function of controlling whether to write a data signal to the node 436.

One of a pair of electrodes of the capacitor 233 is electrically connected to a wiring to which a particular potential is supplied (hereinafter referred to as a capacitor line CL), and the other is electrically connected to the node 436. The other of the pair of electrodes of the liquid crystal element 432 is electrically connected to the node 436. The potential of the capacitor line CL is set in accordance with the specifications of the pixel circuit 137 as appropriate. The capacitor 233 functions as a storage capacitor for storing data written to the node 436.

For example, in the display device including the pixel circuit 137 in FIG. 2B, the pixel circuits 137 are sequentially selected row by row by the driver circuit 121b, whereby the transistors 431 are turned on and a data signal is written to the nodes 436.

When the transistors 431 are turned off, the pixel circuits 137 in which the data signal has been written to the nodes 436 are brought into a holding state. This operation is sequentially performed row by row; thus, an image is displayed on a display portion 122.

The pixel circuit 137 illustrated in FIG. 2C includes the transistor 431, the capacitor 233, a transistor 232, and a transistor 434. The pixel circuit 137 is electrically connected to the light-emitting element 125 that can function as a display element.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m). The signal line DL_n and the scan line GL_m correspond to the scan line 135 and the signal line 136, respectively.

The transistor 431 has a function of controlling whether to write a data signal to a node 435.

One of a pair of electrodes of the capacitor 233 is electrically connected to the node 435, and the other is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other is electrically connected to the node 437. A gate electrode of the transistor 232 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_m.

One of an anode and a cathode of the light-emitting element 125 is electrically connected to a potential supply line VL_b, and the other is electrically connected to the node 437.

As the light-emitting element 125, an organic electroluminescent element (also referred to as an organic EL element) or the like can be used, for example. Note that the light-emitting element 125 is not limited to organic EL elements; an inorganic EL element including an inorganic material can be used, for example.

As a power supply potential, a potential on the relatively high potential side or a potential on the relatively low potential side can be used, for example. A power supply potential on the high potential side is referred to as a high power supply potential VDD (also simply referred to as VDD or H potential), and a power supply potential on the low potential side is referred to as a low power supply potential VSS (also simply referred to as VSS or L potential). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

For example, a high power supply potential VDD is supplied to one of the potential supply line VL_a and the potential supply line VL_b, and a low power supply potential VSS is supplied to the other.

In the display device including the pixel circuit 137 in FIG. 2C, the pixel circuits 137 are sequentially selected row by row by the driver circuit 121b, whereby the transistors 431 and 434 are turned on and a data signal is written to the nodes 435.

When the transistors 431 and 434 are turned off, the pixel circuits 137 in which the data has been written to the nodes 435 are brought into a holding state. Further, the amount of current flowing between the source electrode and the drain electrode of the transistor 232 is controlled in accordance with the potential of the data written to the node 435. The light-emitting element 125 emits light with a luminance corresponding to the amount of flowing current. This operation is sequentially performed row by row; thus, an image is displayed.

[Display Element]

The display device of one embodiment of the present invention can employ various modes and can include various elements. Examples of the display element include an electroluminescent (EL) element (e.g., an EL element including organic and inorganic materials, an organic EL element, or an inorganic EL element) including an LED (e.g., a white LED, a red LED, a green LED, or a blue LED), a transistor (a transistor that emits light depending on current), a plasma display panel (PDP), an electron emitting element, a liquid crystal element, an electrophoretic element, a display element using micro electro mechanical system (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, and an electrowetting element. Other than these elements, display elements including display media whose contrast, luminance, reflectivity, transmittance, or the like is changed by electrical or magnetic effect, such as a piezoelectric ceramic display and a display element including a carbon nanotube, are given as the examples. Alternatively, quantum dots may be used as the display element. Examples of display devices including quantum dots include a quantum dot display. Examples of display devices having EL elements include an EL display. Examples of a display device including an electron emitter include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by metal organic chemical vapor deposition (MOCVD). Note that when the graphene is provided, the GaN semiconductor layers included in the LED can also be formed by a sputtering method.

[Examples of Pixel Configurations for Achieving Color Display]

Figure 4A:
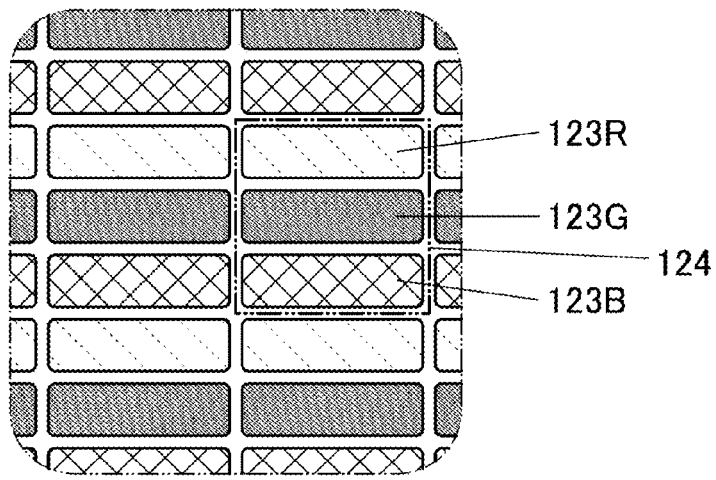
FIGS. 4A and 4B each illustrate an example of a pixel configuration.
Figure 4B:
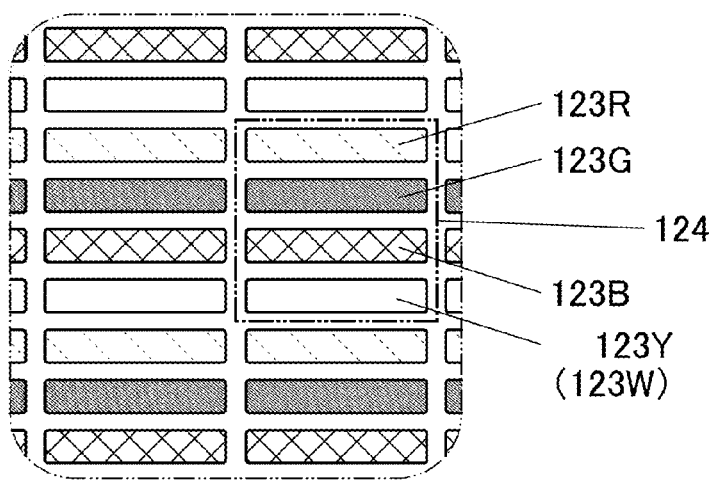

Here, examples of pixel configurations for achieving color display are described with reference to FIGS. 4A and 4B. FIGS. 4A and 4B and FIGS. 5A and 5B are enlarged plan views of the display portion 122. As illustrated in FIG. 4A, for example, each pixel 123 may function as a subpixel and three pixels 123 may be collectively used as one pixel 124. The use of a red coloring layer, a green coloring layer, and a blue coloring layer for the respective three pixels 123 enables full-color display. In FIG. 4A, the pixel 123 emitting red light, the pixel 123 emitting green light, and the pixel 123 emitting blue light are illustrated as a pixel 123R, a pixel 123G, and a pixel 123B, respectively. The colors of the coloring layers may be a color other than red, green, and blue; for example, the colors of the coloring layer may be yellow, cyan, magenta, or the like.

As illustrated in FIG. 4B, four pixels 123 may function as subpixels and may be collectively used as one pixel 124. For example, a red coloring layer, a green coloring layer, a blue coloring layer, and a yellow coloring layer may be provided for the respective four pixels 123. In FIG. 4B, the pixel 123 emitting red light, the pixel 123 emitting green light, the pixel 123 emitting blue light, and the pixel 123 emitting yellow light are illustrated as a pixel 123R, a pixel 123G, a pixel 123B, and a pixel 123Y, respectively. By increasing the number of pixels 123 used in one pixel 124, the range of color reproduction can be widened. Thus, the display quality of the display device can be improved.

Alternatively, the coloring layers corresponding to the four pixels 123 may be red, green, blue, and white (see FIG. 4B). With the pixel 123 emitting white light (pixel 123W), the luminance of the display portion 122 can be increased. Note that in the case where the pixel 123W emitting white light is provided, it is not necessary to provide the coloring layer for the pixel 123W. Without the coloring layer for the pixel 123W, there is no luminance reduction at the time of transmitting light through the coloring layer; thus, the luminance of the display portion 122 can be increased. Moreover, power consumption of the display device can be reduced. On the other hand, color temperature of white light can be controlled with the coloring layer for the pixel 123W. Thus, the display quality of the display device can be improved. Depending on the intended use of the display device, each pixel 123 may function as a subpixel and two pixels 123 may be collectively used as one pixel 124.

Figure 5A:
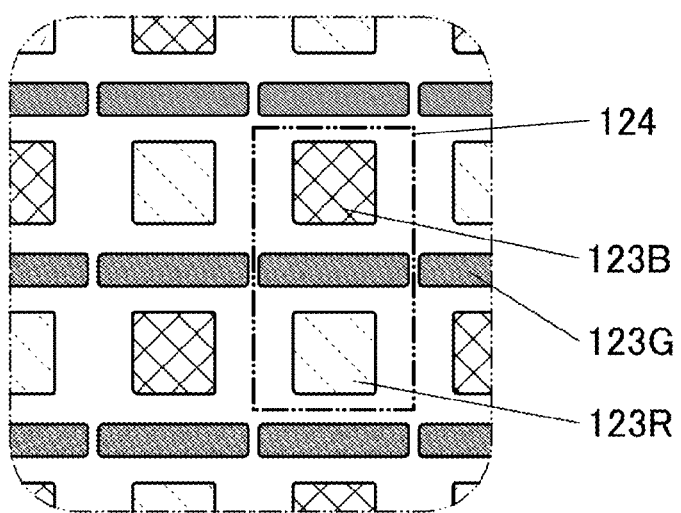
FIGS. 5A and 5B each illustrate an example of a pixel configuration.
Figure 5B:
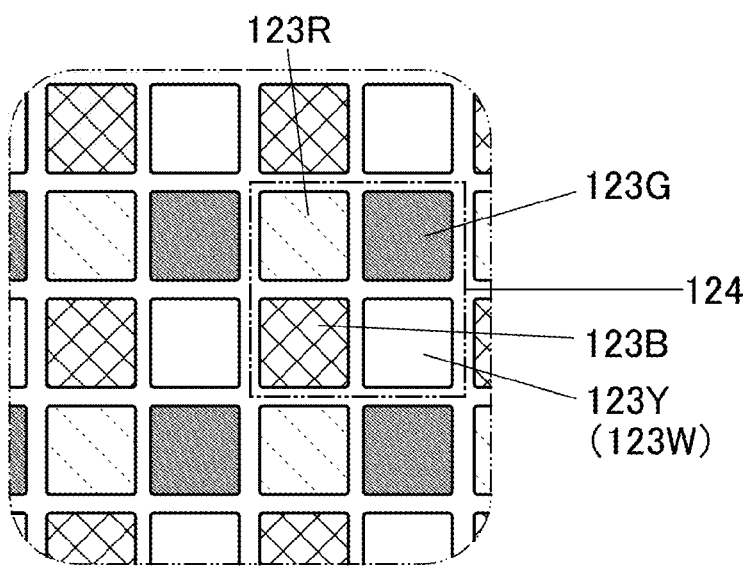

In the case where the four pixels 123 are collectively used as one pixel 124, the four pixels 123 may be arranged in a matrix, as in FIG. 5B. In addition, in the case where the four pixels 123 are collectively used as one pixel 124, a pixel that emits light of cyan, magenta, or the like may be used instead of the pixel 123Y or the pixel 123W. A plurality of pixels 123 that emit light of the same color may be provided in the pixel 124.

Note that the occupation areas or shapes of the pixels 123 included in the pixel 124 may be the same or different. In addition, arrangement is not limited to stripe arrangement or matrix arrangement. For example, delta arrangement, Bayer arrangement, pentile arrangement, or the like may be used. FIG. 5A illustrates an example where pentile arrangement is applied to the pixel 124.

The above is description of examples of pixel configurations for color display.

Next, a signal flow in the display device described in this embodiment is described.

An image signal supply source 101 includes an LVDS transmitter 131. The image signal supply source 101 transmits a serial digital image signal to the receiving circuit 130 via the LVDS transmitter 131. The digital image signal includes, for example, a signal corresponding to red (R), a signal corresponding to green (G), and a signal corresponding to blue (B).

The LVDS receiver 132 in the receiving circuit 130 receives a digital image signal transmitted by a differential signalling from the LVDS transmitter 131. The LVDS receiver 132 converts the received digital image signal into a single-ended signal and transmits it to the SP converter 133. The SP converter 133 converts a serial digital image signal into a parallel digital image signal and transmits it to the image processing circuit 110.

[LVDS Transmitter and LVDS Receiver]

Here, operations of the LVDS transmitter 131 and the LVDS receiver 132 are described with reference to FIGS. 6A and 6B. The LVDS receiver 132 includes an operational amplifier 901. The operational amplifier 901 includes a non-inverted signal input terminal 911, an inverted signal input terminal 912, a standby signal input terminal 913, and an output terminal 914.

The LVDS transmitter 131 outputs a digital image signal (a non-inverted signal 921) and an inverted signal (an inverted signal 922) of the digital image signal at the same time (differential signalling).

The non-inverted signal 921 is input to the non-inverted signal input terminal 911 of the operational amplifier 901, and the inverted signal 922 is input to the inverted signal input terminal 912 of the operational amplifier 901. The operational amplifier 901 compares a potential input to the non-inverted signal input terminal 911 and a potential input to the inverted signal input terminal 912. The operational amplifier 901 outputs an L potential to the output terminal 914 when the potential input to the inverted signal input terminal 912 is higher than the potential input to the non-inverted signal input terminal 911. The operational amplifier 901 outputs an H potential to the output terminal 914 when the potential input to the inverted signal input terminal 912 is lower than the potential input to the non-inverted signal input terminal 911. Thus, the LVDS receiver 132 has a function of comparing potentials of two input signals and outputting an output signal 931 (see FIG. 6A). The LVDS receiver 132 has a function of converting a differential signal into a single-ended signal.

As for noise during communication, the same level of noise occurs in the non-inverted signal 921 and the inverted signal 922 at the same time in many cases. Even when a noise 999 occurs in the non-inverted signal 921 and the inverted signal 922 as shown in FIG. 6B, the noise 999 can be removed by the LVDS receiver 132. In other words, the original digital image signal can be precisely reproduced by the LVDS receiver 132.

When a signal for bringing the operational amplifier 901 into a standby state is input to the standby signal input terminal 913, supply of a bias current to the operational amplifier 901 is stopped. When the supply of a bias current is stopped, the operational amplifier 901 stops comparing potentials input to the non-inverted signal input terminal 911 and the inverted signal input terminal 912 (standby state). Note that the standby state of the operational amplifier 901 might make the potential of the output terminal 914 unstable, which leads to malfunction in some cases. For this reason, when the operational amplifier 901 is in a standby state, the potential of the output terminal 914 is preferably fixed at an L potential or an H potential (see FIG. 6C).

The above is description of operations of the LVDS transmitter 131 and the LVDS receiver 132.

The image processing circuit 110 has a function of generating an image signal per frame period in accordance with an input parallel signal. The memory circuit 111 provided in the image processing circuit 110 includes a plurality of frame memories for storing image signals for the respective frame periods. Note that the frame memory may be formed with a memory element such as a dynamic random access memory (DRAM) or a static random access memory (SRAM).

Note that the receiving circuit 130 may generate an image signal per frame period and supply the image signal to the image processing circuit 110.

Note that the number of frame memories is not particularly limited as long as an image signal can be stored for each frame period.

The comparison circuit 112 selectively reads out image signals for two consecutive frames stored in the memory circuit 111, in accordance with an instruction by the control circuit 113. The comparison circuit 112 compares image signals for two consecutive frames and detects a difference.

The control circuit 113 determines operations of the display panel 120 and the LVDS receiver in accordance with the difference detection result by the comparison circuit 112. Specifically, the control circuit 113 determines that the period is the moving image display period when the comparison circuit 112 detects an image signal difference between two consecutive frames. In contrast, the control circuit 113 determines that the period is the still image display period when the comparison circuit 112 does not detect a difference.

Note that the control circuit 113 may determine that there is a difference when a difference detected by the comparison circuit 112 exceeds a certain level. Alternatively, the control circuit 113 may determine the presence or absence of a difference by comparing a difference between this period and the previous period and a difference between the previous period and the period before the previous period.

In this specification and the like, a moving image is an image that is produced by sequentially displaying at high speed a plurality of images assigned to a plurality of frames on the time series, and thus is recognized by human eyes as a motion image. Specifically, an image produced by sequentially displaying images at least 60 times (60 frames) per second can be recognized by human eyes as a motion image with less flickering. In contrast, unlike a moving image or a partial moving image which includes a moving image and a still image in one frame, a still image is an image which does not change in consecutive frame periods, for example, in an n-th frame and an (n+1)th frame though a plurality of images which is time-divided into a plurality of frame periods is switched at high speed.

The image processing circuit 110 may include a plurality of switches such as a switch formed using a transistor.

In the moving image display period, the control circuit 113 selects an image signal from image signals stored in frame memories in the memory circuit 111 and transmits it to the display panel 120. The control circuit 113 does not transmit an image signal to the display panel 120 in the still image display period, which can reduce the power consumption of the display device 100. Note that operation that the control circuit 113 makes the display device 100 perform in the moving image display period is called a moving image mode, and operation that the control circuit 113 makes the display device 100 perform in the still image display period is called a still image mode.

The control circuit 113 has a function of supplying a signal for controlling switching between supply and stop of supply of a control signal, such as a start pulse SP and a clock signal CK, to the display panel 120. The control circuit 113 has a function of supplying a signal for starting or stopping the operation of the receiving circuit 130.

In the still image display period, the control circuit 113 transmits to the display panel 120 a signal for stopping supply of a control signal such as a clock signal CK. As a result, supply of the control signal to a driver circuit 121 is stopped, so that the operation of the driver circuit 121 is stopped. In the still image display period, the control circuit 113 transmits to the receiving circuit 130 a signal for stopping the operation (a standby signal). As a result, supply of a bias current to the operational amplifier 901 is stopped. Thus, power consumption of the display device 100 can be reduced.

In the moving image display period, the control circuit 113 transmits to the display panel 120 a signal for supplying a control signal. The control circuit 113 transmits to the receiving circuit 130 a signal for starting the operation. The control circuit 113 transmits an image signal to the display panel 120.

In this embodiment, whether the period is the moving image display period or the still image display period is determined in accordance with detection of an image signal difference between two consecutive frames by the comparison circuit 112. However, the still image display period and the moving image display period may be switched by a signal supplied to the image processing circuit 110 from the outside. That is, the image processing circuit 110 described in this embodiment may include a mode-switching circuit. The mode-switching circuit is a circuit for switching the moving image mode and the still image mode by a user of the display device by hand or with an external connection device.

For example, the control circuit 113 can transmit an image signal to the display panel 120 in accordance with a signal input to the mode-switching circuit. For example, when a mode-switching signal is input from the mode-switching circuit to the control circuit 113 while operation is performed in the still-image display mode, even when the comparison circuit 112 does not detect an image signal difference between two consecutive frames, the control circuit 113 can be operated in a mode in which the control circuit 113 sequentially transmits received image signals to the display panel 120, that is, in a moving image display mode. When the control circuit 113 receives a mode-switching signal from the mode-switching circuit when being operated in the moving image display mode, it is possible for the control circuit 113 not to transmit an image signal to the display panel 120 even while the comparison circuit 112 is detecting an image signal difference between two consecutive frames. Consequently, the display device of this embodiment displays one frame of a moving image, as a still image.

The display device described in this embodiment may include a photometric circuit. The display device provided with the photometric circuit can detect the brightness of the environment where the display device is put. As a result, the control circuit 113 connected to the photometric circuit can change a display state of the display panel 120 in accordance with a signal input from the photometric circuit.

For example, when the photometric circuit detects that the display device described in this embodiment is being used in a dim environment, visibility of the display device 100 can be increased by decreasing emission luminance of the display portion 122. In contrast, when the photometric circuit detects that the display device described in this embodiment is being used in a bright environment, visibility of the display device 100 can be increased by increasing emission luminance of the display portion 122.

In a period in which a still image is displayed using a structure of this embodiment, frequent writings of image signals can be eliminated.

When seeing an image formed by writing image signals a plurality of times, the human eyes perceive images switched a plurality of times, which might lead to eyestrain. With a structure in which the frequency of writing of image signals is reduced as described in this embodiment, eyestrain can be alleviated.

In Embodiment 1, one embodiment of the present invention has been described. The example in which one embodiment of the present invention is applied to LVDS is described; however, one embodiment of the present invention is not limited thereto. Depending on circumstances or conditions, one embodiment of the present invention may be applied to another transmission technology, such as DVI, HDMI (registered trademark), eDP, iDP, V-by-One HS, FPD-Link II, Advanced PPmL, or PCI. Depending on circumstances or conditions, one embodiment of the present invention may be applied to wireless transmission technology. Depending on circumstances or conditions, one embodiment of the present invention is not necessarily applied to LVDS.

This embodiment can be implemented in an appropriate combination with any of the other embodiments described in this specification.

(Embodiment 2)

Figure 9:
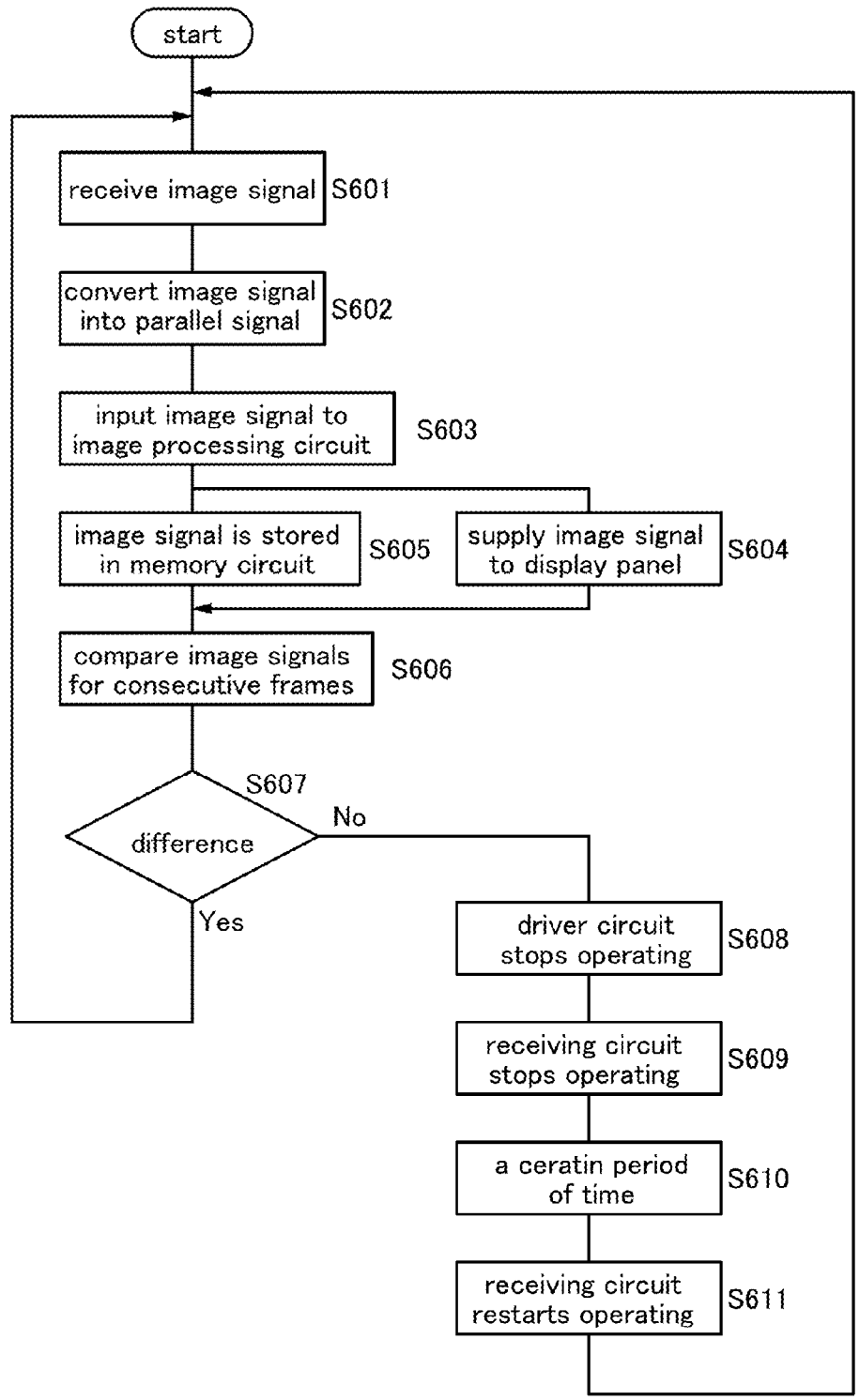
FIG. 9 is a flow chart showing one embodiment of a display device.

In this embodiment, an operation example of the display device 100 is described. The operation periods of the display device 100 have a moving image display period 301 and a still image display period 302. In this embodiment, the moving image display period 301 and the still image display period 302 are described with reference to FIGS. 7A to 7C. FIG. 9 is a flow chart showing an operation example of the display device 100. The case where the display device 100 is a liquid crystal display device including the pixel 123 illustrated in FIG. 2B is described as an example.

The cycle of one frame period (or frame frequency) is preferably less than or equal to $\frac{1}{60}$ sec (more than or equal to 60 Hz) in the moving image display period 301. The high frame frequency can prevent a viewer from perceiving flickering. In the still image display period 302, the cycle of one frame period is extremely long, for example, longer than or equal to one minute (less than or equal to 0.017 Hz), so that eyestrain can be reduced compared to the case where the same image is switched plural times.

A transistor including an oxide semiconductor in an oxide semiconductor layer is preferably used as the transistor 431. The transistor including an oxide semiconductor in a semiconductor layer can have significantly low off-state current, and thus can hold data written in the node 436 for a long period. Therefore, the cycle of one frame period can be increased, and the frequency of refresh operations in the still image display period 302 can be reduced, whereby power consumption of the display device 100 can be reduced.

Figure 7A:
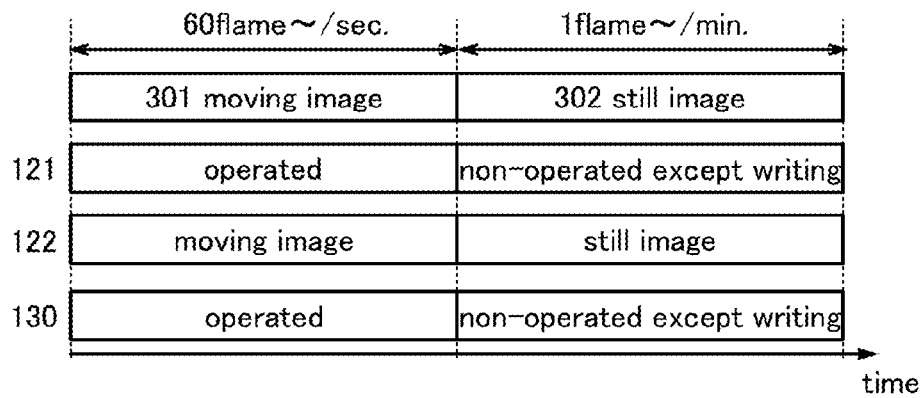
FIGS. 7A to 7C are timing charts showing operation of a display device.

In the moving image display period 301 shown in FIG. 7A, a control signal for displaying a moving image (e.g., a clock signal GCK, a start pulse GSP, a clock signal SCK, or a start pulse SSP) is supplied to the driver circuit 121 (the driver circuit 121a and the driver circuit 121b), whereby the driver circuit 121 is operated. An image signal is supplied to the pixel 123 included in the display panel 120, which enables moving image display. The receiving circuit 130 is being operated.

In the still image display period 302 shown in FIG. 7A, all the transistors 431 in the display portion 122 are turned off, whereby image rewriting is stopped. In addition, supply of a control signal to the driver circuit 121a and the driver circuit 121b is stopped, so that the driver circuits stop operating. Moreover, supply of a bias current to the LVDS receiver 132 is stopped; as a result, at least part of the receiving circuit 130 stops operating.

Figure 7B:
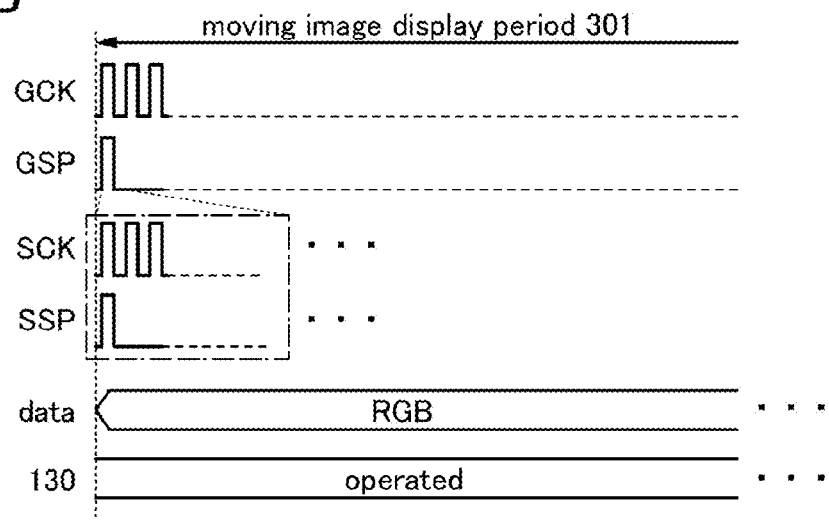
Figure 7C:
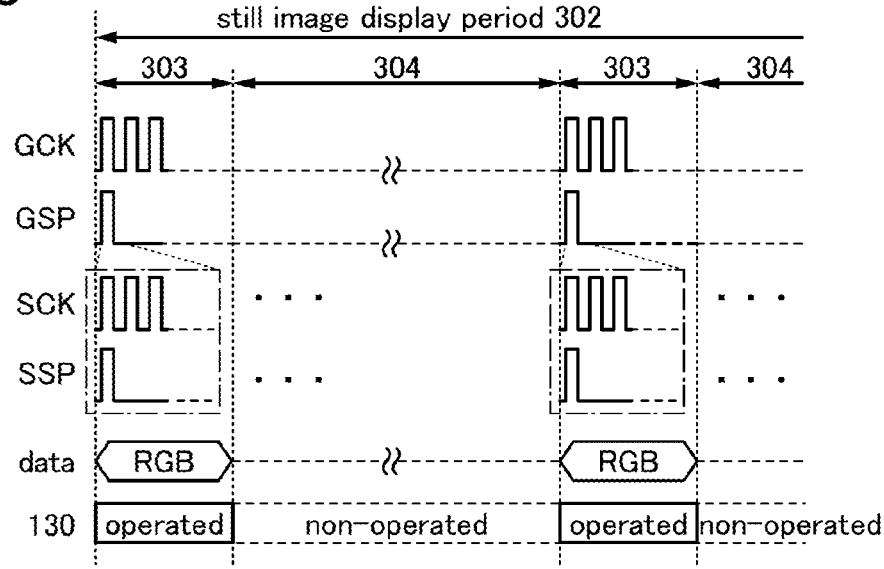

Next, the moving image display period 301 shown in FIG. 7A is described in detail with reference to a timing chart of FIG. 7B. The still image display period 302 is described in detail with reference to a timing chart of FIG. 7C. The timing charts shown in FIGS. 7B and 7C are exaggerated for description, and signals do not operate in synchronization otherwise specified.

[Moving Image Display Period]

First, operation in the moving image display period (moving image mode) is described with reference to FIG. 7B and FIG. 9. FIG. 7B shows a clock signal GCK (GCK in FIG. 7B) and a start pulse GSP (GSP in FIG. 7B) which are supplied to the driver circuit 121b, a clock signal SCK (SCK in FIG. 7B) and a start pulse SSP (SSP in FIG. 7B) which are supplied to the driver circuit 121a, an image signal (data in FIG. 7B), and operation states of the receiving circuit 130 in the moving image display period 301 as an example.

In the moving image display period 301, the clock signal GCK is a clock signal that is always supplied. The start pulse GSP is a pulse corresponding to vertical synchronization frequency. The clock signal SCK is a clock signal that is always supplied. The start pulse SSP is a pulse corresponding to one gate selection period for one row.

[Still Image Display Period]

Next, operation in the still image display period (still image mode) is described with reference to FIG. 7C. In FIG. 7C, the still image display period 302 is divided into a still-image writing period 303 and a still-image holding period 304.

In the still-image writing period 303, the clock signal GCK supplied to the driver circuit 121b is a clock signal for writing an image signal for one frame. The start pulse GSP supplied to the driver circuit 121b is a pulse for writing an image signal for one frame. The clock signal SCK supplied to the driver circuit 121a is a clock signal for writing an image signal for one frame. The start pulse SSP supplied to the driver circuit 121 a is a pulse for writing an image signal for one frame.

In the still-image holding period 304, supply of the clock signal GCK, the start pulse GSP, the clock signal SCK, and the start pulse SSP for driving the driver circuit 121a and the driver circuit 121b is stopped. For this reason, the driver circuit 121 (the driver circuit 121a and the driver circuit 121b) stops operating in the still-image holding period 304, which can reduce power consumption of the display device 100.

In the still-image holding period 304, operation of the receiving circuit 130 is stopped. Specifically, supply of a bias current to the operational amplifier 901 included in the LVDS receiver 132 is stopped, whereby the operational amplifier 901 brought into a standby state. As a result, power consumption of the display device 100 can be further reduced.

In the still-image holding period 304, an image signal written to a pixel in the still-image writing period 303 is held by a transistor having an extremely low off-state current; therefore, a color still image can be maintained for a minute or longer. Note that if the still-image holding period 304 is too long, potential of an image signal held in the node 436 might change, which might decrease the display quality of a displayed still image. For this reason, before the potential of the image signal held in the node 436 changes beyond the acceptable range, it is preferable that the still-image writing period 303 be newly provided and an image signal the same as that in the previous period be written (refresh operation), and then the still-image holding period 304 start again.

The control circuit 113 makes the receiving circuit 130 operate when performing refresh operation, and determines that the period is the moving image display period or the still image display period. When the control circuit 113 determines that the period is the still image display period, the control circuit 113 makes the display device 100 operate in the still-image mode. When the control circuit 113 determines that the period is the moving image display period, the control circuit 113 makes the display device 100 operate in the moving image mode.

Figure 8:
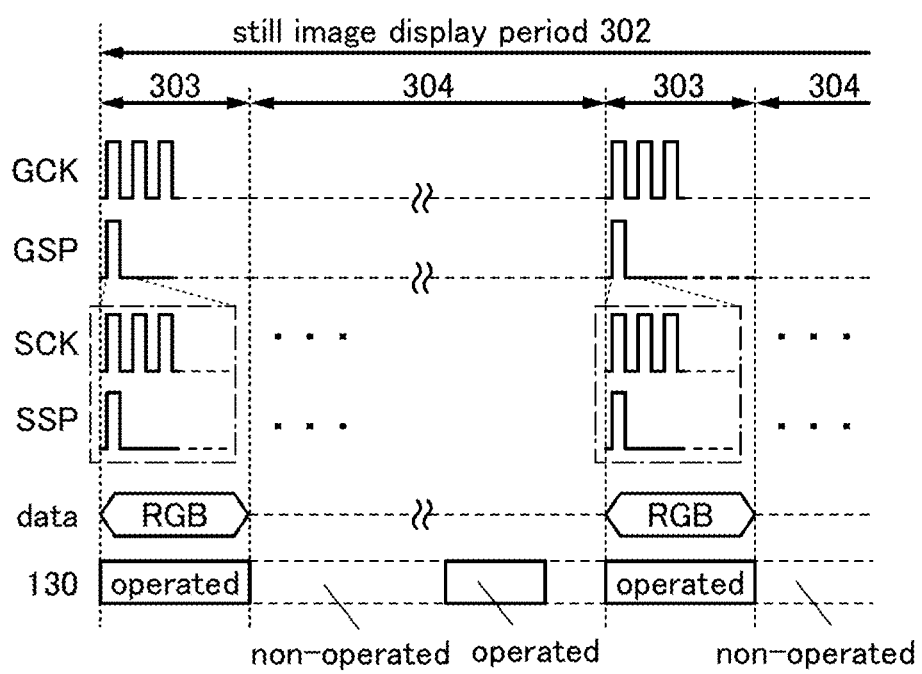
FIG. 8 is a timing chart showing operation of a display device.

Alternatively, the control circuit 113 may make the receiving circuit 130 operate at a certain timing in the still-image holding period 304, and may determine whether the period is the moving image display period or the still image display period (see FIG. 8). When the control circuit 113 determines that the period is the moving image display period, the control circuit 113 makes the display device 100 operate in the moving image mode. When the control circuit 113 determines that the period is the still image display period, the control circuit 113 makes the display device 100 remain in the still-image mode.

In the still image display period, operations of the SP converter 133, the memory circuit 111, and/or the comparison circuit 112 may be stopped. By stopping circuits whose operations are not directly involved in display, power consumption of the display device can be further reduced.

[Flow Chart]

Next, an operation example of the display device 100 is described with reference to a flow chart of FIG. 9.

The receiving circuit 130 receives a serial digital image signal transmitted by the digital image signal supply source 101 (Step S601). The digital image signal is converted into a parallel signal by the SP converter 133 (Step S602) and input to the image processing circuit 110 (Step S603).

The digital image signal input to the image processing circuit 110 is converted into an image signal (data) and supplied to the display panel 120 (Step S604). Specifically, in the moving image display period 301, data corresponding to red (R), data corresponding to green (G), and data corresponding to blue (B) are written to the node 436 in the pixel 123; thus, viewers can see color moving image display.

The digital image signal input to the image processing circuit 110 is stored in the memory circuit 111 (Step S605) per frame. Next, the comparison circuit 112 compares image signals for two consecutive frames (Step S606). In the case where the comparison circuit 112 detects a difference, the control circuit 113 determines that the period is the moving image display period, and the image processing circuit 110 keeps receiving signals transmitted by the image signal supply source 101 (Step S607). In the case where the comparison circuit 112 does not detect a significant difference, the control circuit 113 determines that the period is the still image display period, and the driver circuit 121 and the receiving circuit 130 stop operating (Step S608 and Step S609).

After a certain period of time (Step S610), the receiving circuit 130 restarts operating (Step S611), receives a digital image signal (Step S601), and supplies an image signal (data) to the display panel 120 (Step S604); thus, image is written to the display portion 122.

After that, in the case where the period is determined as the still image display period at Step S607, refresh operation is performed at Step S604.

In the case where the display device 100 is an EL display device including the pixel 123 illustrated in FIG. 2C, the display device can be operated in the above manner. When the pixel 123 illustrated in FIG. 2C is used, transistors including an oxide semiconductor in a semiconductor layer are preferably used as the transistor 431, the transistor 434, and the transistor 232.

In the display device described in this embodiment, low power consumption can be achieved in displaying a still image.

In Embodiment 2, one embodiment of the present invention has been described. In Embodiment 2, an example of one embodiment of the present invention in which at least part of the receiving circuit stops operating in the still image display period is described, but one embodiment of the present invention is not limited to this example. Depending on circumstances or conditions, in one embodiment of the present invention, a circuit other than the receiving circuit may stop at least part of the operation in the still image display period. Alternatively, depending on circumstances or conditions, in one embodiment of the present invention, a circuit other than the receiving circuit may stop at least part of operation in a period other than the still image display period. Further alternatively, depending on circumstances or conditions, in one embodiment of the present invention, the receiving circuit does not necessarily stop operating in the still image display period.

This embodiment can be implemented in an appropriate combination with any of the structures described in the other embodiments.

(Embodiment 3)

In this embodiment, another structure example of the display device 100 is described with reference to the drawings. A display device 100a described in this embodiment can have a structure similar to that of the display device 100. In this embodiment, different points between the display device 100a and the display device 100 are mainly described. Embodiments 1 and 2 can be referred to for portions of the display device 100a which are the same as those of the display device 100.

FIG. 10 is a block diagram illustrating a structure of the display device 100a described in this embodiment. The display device 100a includes the display panel 120 and a receiving circuit 130a. The display panel 120 includes the driver circuit 121 and the display portion 122. The display portion 122 includes the pixel 123. The receiving circuit 130a includes the LVDS receiver 132 and the SP converter 133.

The display device 100a does not include the image processing circuit 110, which is different from the display device 100. The display device 100a without the image processing circuit 110 can reduce its power consumption as compared with the display device 100.

The image signal supply source 101 transmits a serial digital image signal to the receiving circuit 130a and an image processing device 140 via the LVDS transmitter 131. The digital image signal includes, for example, a signal corresponding to red (R), a signal corresponding to green (G), and a signal corresponding to blue (B).

The receiving circuit 130a receives a serial digital image signal transmitted by the digital image signal supply source 101. Then, the serial digital image signal is converted into a parallel digital image signal by the SP converter 133. The receiving circuit 130a generates an image signal from the digital image signal per frame period, and transmits the image signal to the display panel 120.

An LVDS receiver 142 in the image processing device 140 receives a digital image signal transmitted from the LVDS transmitter 131 in the image signal supply source 101. Then, the image processing device 140 generates an image signal from the digital image signal per frame period. The image signal is stored in the memory circuit 111 per frame period. Note that the image signal may be either a serial image signal or a parallel image signal.

The comparison circuit 112 selectively reads out image signals for two consecutive frames stored in the memory circuit 111, in accordance with an instruction by the control circuit 113. The comparison circuit 112 compares image signals for two consecutive frames and detects a difference.

The control circuit 113 determines the operation mode of the display device 100a in accordance with a difference detected by the comparison circuit 112. Specifically, the control circuit 113 determines that the period is the moving image display period when the comparison circuit 112 detects an image signal difference between two consecutive frames. In contrast, the control circuit 113 determines that the period is the still image display period when the comparison circuit 112 does not detect a difference.

In the case where the control circuit 113 determines the period as the still image display period, the control circuit 113 transmits a control signal for operating the display device 100a in the still image mode to the receiving circuit 130a through the LVDS transmitter 141. Specifically, the control circuit 113 transmits a control signal for bringing the operational amplifier 901 included in the LVDS receiver 132 into a standby state. In the case where the control circuit 113 determines the period as the moving image display period, the control circuit 113 transmits a control signal for operating the display device 100a in the moving image mode to the receiving circuit 130a through the LVDS transmitter 141. Specifically, the control circuit 113 transmits a control signal for returning the operational amplifier 901 included in the LVDS receiver 132 from the standby state to a normal operation state.

Figure 11A:
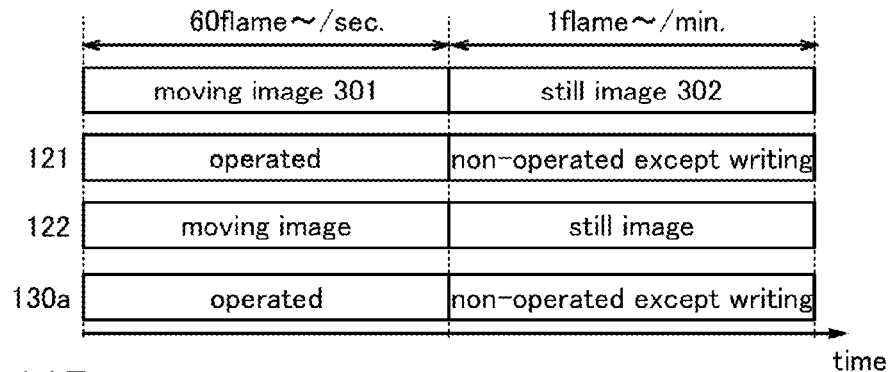
FIGS. 11A to 11C are timing charts showing operation of a display device.

FIG. 11A is a timing chart for describing operation of the display device 100a. In the moving image display period 301 shown in FIG. 11A, a control signal for displaying a moving image (e.g., a clock signal GCK, a start pulse GSP, a clock signal SCK, or a start pulse SSP) is supplied to the driver circuit 121, whereby the driver circuit is operated. An image signal is supplied to the pixel 123 included in the display panel 120, which enables moving image display. The receiving circuit 130a is being operated.

In the still image display period 302 shown in FIG. 11A, all the transistors 431 in the display portion 122 are turned off, whereby image rewriting is stopped. In addition, supply of a control signal to the driver circuit 121 is stopped, so that the driver circuits stop operating. Moreover, supply of a bias current to the LVDS receiver 132 is stopped; as a result, at least part of the receiving circuit 130a stops operating.

Figure 11B:
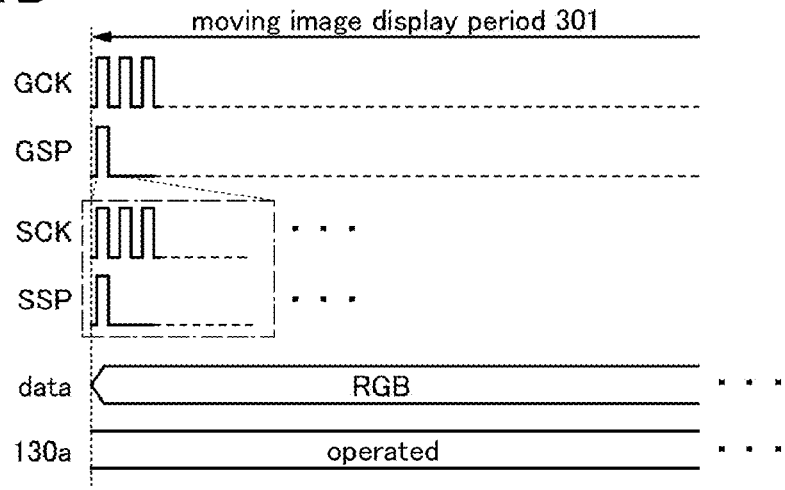
Figure 11C:
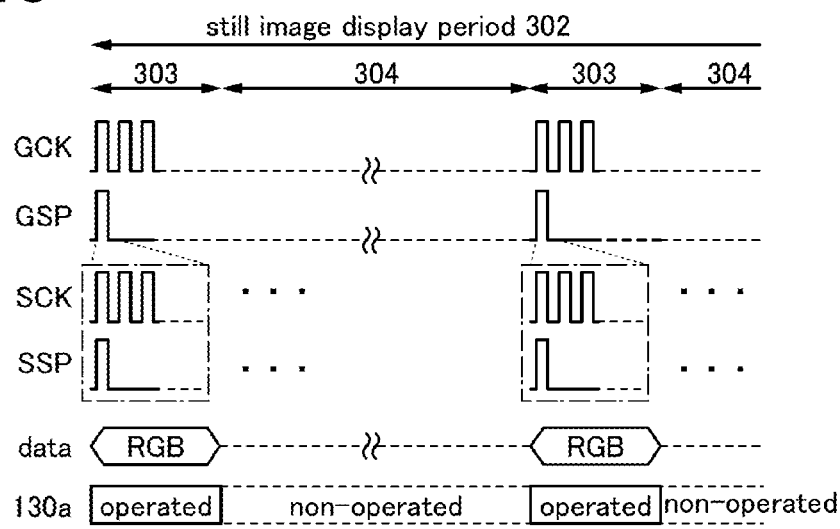

When a control signal for operating the display device 100a in the still image mode is input to the receiving circuit 130a, the receiving circuit 130a writes an image signal for one frame to the display panel 120 (see the still-image writing period 303 in FIG. 11C), and then stops supplying a clock signal and a start pulse to the driver circuit 121 and supplying a bias current to the operational amplifier 901 (see the still-image holding period 304 in FIG. 11C).

In the still-image holding period 304, an image signal written to the pixel 123 is held in a transistor having an extremely low off-state current; therefore, a color still image can be maintained for a minute or longer. Note that if the still-image holding period 304 is too long, potential of an image signal held in the node 436 might change, which might decrease the display quality of a displayed still image. For this reason, before the potential of the image signal held in the node 436 changes beyond the acceptable range, it is preferable that the operational amplifier 901 be returned from the standby state and an image signal for one frame be written to the display panel 120 (refresh operation), and then the still-image holding period 304 start again.

When a control signal for operating the display device 100*a* in the moving image mode is input to the receiving circuit 130*a*, supply of a bias current to the operational amplifier 901 is restarted; thus, the receiving circuit 130*a* starts to operate. Then, a clock signal and a start pulse are supplied to the driver circuit 121, and an image signal is supplied to the display portion 122 (see FIG. 11B).

Figure 12:
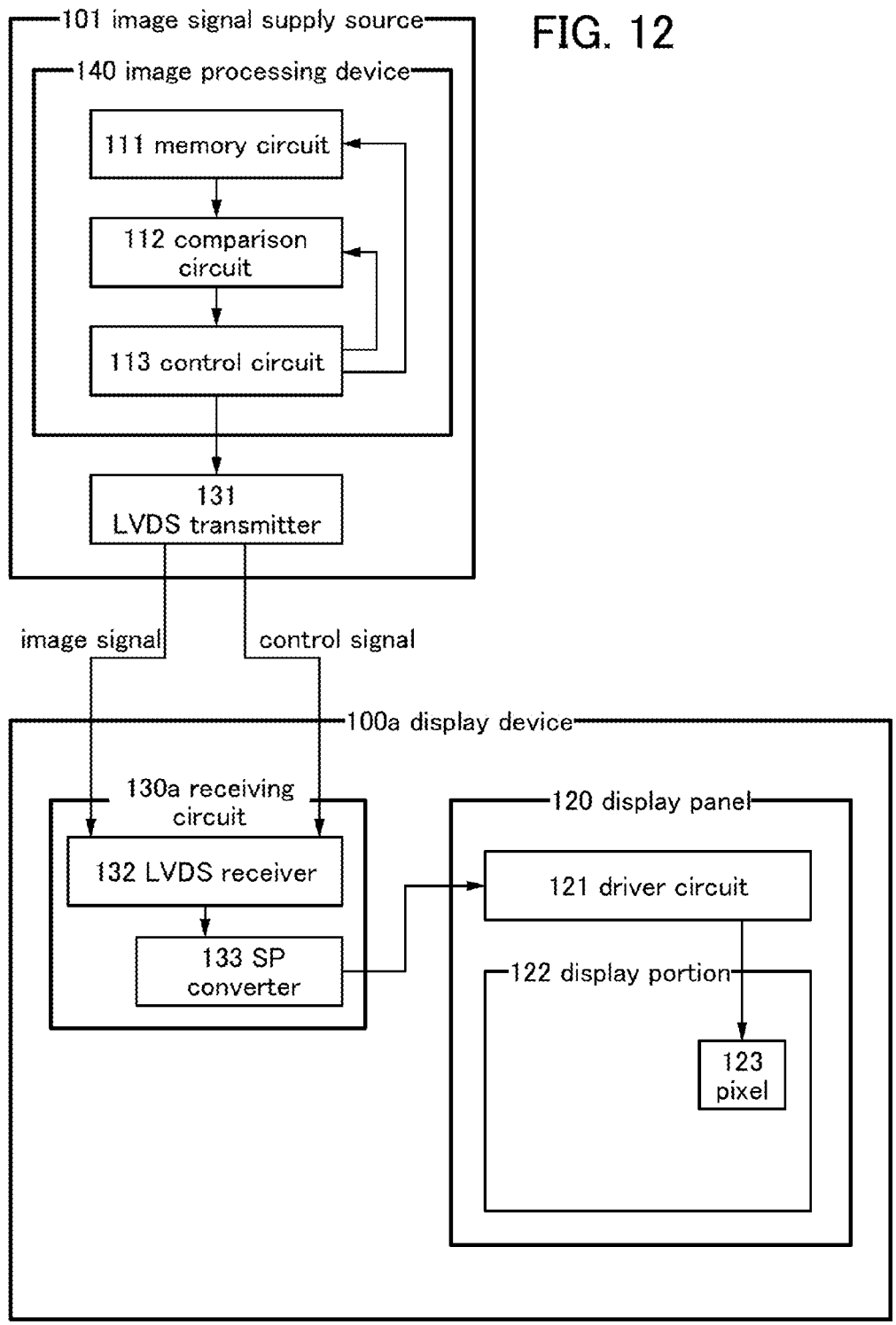
FIG. 12 is a block diagram illustrating one embodiment of a display device.

In the above manner, the display device 100*a* can be operated. As illustrated in FIG. 12, the image processing device 140 may be provided in the image signal supply source 101. Alternatively, as illustrated in FIG. 13, the image signal supply source 101 may be provided in the image processing device 140. In the structures illustrated in FIG. 12 and FIG. 13, the LVDS transmitter 141 and the LVDS receiver 142 can be omitted.

In the case where it is not necessary to provide the image processing circuit 110 and/or the image processing device 140, a structure illustrated in FIG. 14 may be employed.

This embodiment can be implemented in an appropriate combination with any of the structures described in the other embodiments.

(Embodiment 4)

In this embodiment, an example of a transistor which can be used instead of the transistor 431, 434, and/or the transistor 232 described in the above embodiments is described with reference to cross-sectional views of FIGS. 15A1 to 15C2.

[Bottom-Gate Transistor]

A transistor 400 illustrated in FIG. 15A1 is a channel-etched transistor that is a type of bottom-gate transistor. The transistor 400 is provided over a substrate 116 with an insulating layer 119 positioned therebetween. The transistor 400 includes an electrode 206, an insulating layer 207 over the electrode 206, a semiconductor layer 208 over the insulating layer 207, and an electrode 214 and an electrode 215 which are in contact with part of the semiconductor layer 208. The electrode 206 can function as a gate electrode. The insulating layer 207 can function as a gate insulating layer. One of the electrodes 214 and 215 can function as a source electrode and the other can function as a drain electrode. An insulating layer 210 and an insulating layer 211 are formed to cover the semiconductor layer 208, the electrode 214, and the electrode 215.

An organic resin material, a glass material, a metal material (including an alloy material), or the like can be used for the substrate 116.

Particularly, the organic resin material has a specific gravity smaller than that of the glass material or the metal material. Thus, when an organic resin material is used for the substrate 116, the weight of the display device can be reduced.

The substrate 116 is preferably formed using a material with high toughness. In that case, a display device with high impact resistance that is less likely to be broken can be provided. The organic resin material and the metal material have higher toughness than the glass material in many cases. When the organic resin material or the metal material is used as the substrate 116, a display device that is less likely to be broken can be provided as compared with the case of using the glass material.

The metal material has higher thermal conductivity than the organic resin material or the glass material and thus can easily conduct heat to the whole substrate. Accordingly, a local temperature rise in the display device can be suppressed.

The insulating layers 119, 207, 210, and 211 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layers 119, 207, 210, and 211 can be formed by a sputtering method, a CVD method, a thermal oxidation method, a coating method, a printing method, or the like. Note that in the case where an organic semiconductor is used for the semiconductor layer 208, an organic material such as polyimide or an acrylic resin may be used for the insulating layer 207.

In this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

For a conductive material for forming the electrode 206, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor having a high electric conductivity typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The electrodes 206, 214, and 215 can also be formed using a conductive material containing oxygen, such as indium tin oxide (hereinafter also referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen, such as titanium nitride or tantalum nitride. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

The electrodes 206, 214, and 215 may be formed with a conductive high molecular material (also referred to as conductive polymer). As the conductive high molecular material, a π electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be used.

The electrodes 206, 214, and 215 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, an alloy containing aluminum and one or more elements selected from titanium, tantalum, tungsten, molybdenum, chromium, neodymium, and scandium may be used as the electrodes 206, 214, and 215.

The semiconductor layer 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In the case where an organic semiconductor is used for the semiconductor layer 208, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmittance. In a transistor obtained by processing an oxide semiconductor under appropriate conditions, an off-state current can be extremely low. For example, the off-state current per 1 μm of a channel width can be less than or equal to 100 zA ($1\times10^{-19}$ A), less than or equal to 10 zA ($1\times10^{-20}$ A), and further less than or equal to 1 zA ($1\times10^{-21}$ A) when the source-drain voltage is 3.5 V at 25° C. Thus, a display device with low power consumption can be provided.

In the case where an oxide semiconductor is used for the semiconductor layer 208, an insulating layer containing oxygen is preferably used as an insulating layer in contact with the semiconductor layer 208. For the insulating layer in contact with the semiconductor layer 208, it is particularly preferable to use an insulating layer from which oxygen is released by heat treatment.

A transistor 401 illustrated in FIG. 15A2 is different from the transistor 400 in that an electrode 213 that can function as a back gate electrode is provided over the insulating layer 211. The electrode 213 can be formed using a material and a method that are similar to those of the electrode 206. The electrode 213 may be formed between the insulating layer 210 and the insulating layer 211.

In general, the back gate electrode is formed using a conductive layer and positioned so that the channel formation region of the semiconductor layer is provided between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrodes 206 and 213 can both function as a gate electrode. Thus, the insulating layers 207, 210, and 211 can all function as a gate insulating layer.

In the case where one of the electrode 206 and the electrode 213 is simply referred to as a "gate electrode", the other can be referred to as a "back gate electrode". For example, in the transistor 401, in the case where the electrode 213 is referred to as a "gate electrode", the electrode 206 is referred to as a "back gate electrode". In the case where the electrode 213 is used as a "gate electrode", the transistor 401 is a kind of bottom-gate transistor. Furthermore, one of the electrode 206 and the electrode 213 may be referred to as a "first gate electrode", and the other may be referred to as a "second gate electrode".

By providing the electrode 206 and the electrode 213 with the semiconductor layer 208 provided therebetween and setting the potentials of the electrode 206 and the electrode 213 to be the same, a region of the semiconductor layer 208 through which carriers flow is enlarged in the film thickness direction; thus, the number of transferred carriers is increased. As a result, the on-state current and the field-effect mobility of the transistor 401 are increased.

Therefore, the transistor 401 has large on-state current for the area occupied thereby. That is, the area occupied by the transistor 401 can be small for required on-state current. With one embodiment of the present invention, the area occupied by a transistor can be reduced. Therefore, with one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, a function of blocking static electricity).

Since the electrode 206 and the electrode 213 each have a function of blocking an electric field generated outside, charges of charged particles and the like generated on the substrate 116 side or above the electrode 213 do not influence the channel formation region in the semiconductor layer 208. Therefore, degradation in a stress test (e.g., a negative gate bias temperature (−GBT) stress test in which negative charges are applied to a gate) can be reduced, and changes in the rising voltages of on-state current at different drain voltages can be suppressed. Note that this effect is caused when the same potential or different potentials are supplied to the electrodes 206 and 213.

The BT stress test is one kind of accelerated test and can evaluate, in a short time, a change by long-term use (i.e., a change over time) in characteristics of transistors. In particular, the change in threshold voltage of the transistor between before and after the BT stress test is an important indicator when examining the reliability of the transistor. If the change in the threshold voltage between before and after the BT stress test is small, the transistor has higher reliability.

By providing the electrode 206 and the electrode 213 and setting the potentials of the electrode 206 and the electrode 213 to be the same, the change in threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

A transistor 410 shown in FIG. 15B1 as an example is a channel-protective transistor that is a type of bottom-gate transistor. The transistor 410 includes an insulating layer 209 that can function as a channel protective layer over a channel formation region in the semiconductor layer 208. The insulating layer 209 can be formed using a material and a method that are similar to those of the insulating layer 207. Part of the electrode 214 and part of the electrode 215 are formed over the insulating layer 209.

With the insulating layer 209 provided over the channel formation region, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

A transistor 411 illustrated in FIG. 15B2 is different from the transistor 410 in that an electrode 213 that can function as a back gate electrode is provided over the insulating layer 211. The electrode 213 can be formed using a material and a method that are similar to those of the electrode 206. The electrode 213 may be formed between the insulating layer 210 and the insulating layer 211.

A transistor 420 shown in FIG. 15C1 as an example is a channel-protective transistor that is a type of bottom-gate transistor. The transistor 420 has substantially the same structure as the transistor 410 but is different from the transistor 410 in that the insulating layer 209 covers the side surfaces of the semiconductor layer 208. The semiconductor layer 208 is electrically connected to the electrode 214 in an opening which is formed by selectively removing part of the insulating layer 209. The semiconductor layer 208 is electrically connected to the electrode 215 in the opening which is formed by selectively removing part of the insulating layer 209. A region of the insulating layer 209 which overlaps with the channel formation region can function as a channel protective layer.

A transistor 421 illustrated in FIG. 15C2 is different from the transistor 420 in that the electrode 213 that can function as a back gate electrode is provided over the insulating layer 211.

With the insulating layer 209, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

The length between the electrode 214 and the electrode 206 and the length between the electrode 215 and the electrode 206 in the transistors 420 and 421 are longer than those in the transistors 410 and 411. Thus, the parasitic capacitance generated between the electrode 214 and the electrode 206 can be reduced. Moreover, the parasitic capacitance generated between the electrode 215 and the electrode 206 can be reduced. With one embodiment of the present invention, a transistor with favorable electrical characteristics can be achieved.

[Top-Gate Transistor]

A transistor 430 shown in FIG. 16A1 as an example is a type of top-gate transistor. The transistor 430 includes the semiconductor layer 208 over the insulating layer 119; the electrode 214 in contact with part of the semiconductor layer 208 and the electrode 215 in contact with part of the semiconductor layer 208, over the semiconductor layer 208 and the insulating layer 119; the insulating layer 207 over the semiconductor layer 208, the electrode 214 and the electrode 215; and the electrode 206 over the insulating layer 207. The insulating layer 210 and the insulating layer 211 are formed over the electrode 206.

Since, in the transistor 430, the electrode 206 overlaps with neither the electrode 214 nor the electrode 215, the parasitic capacitance generated between the electrode 206 and the electrode 214 and the parasitic capacitance generated between the electrode 206 and the electrode 215 can be reduced. After the formation of the electrode 206, an impurity element 221 is introduced into the semiconductor layer 208 using the electrode 206 as a mask, so that an impurity region can be formed in the semiconductor layer 208 in a self-aligned manner. With one embodiment of the present invention, a transistor with favorable electrical characteristics can be achieved.

The introduction of the impurity element 221 can be performed with an ion implantation apparatus, an ion doping apparatus, or a plasma treatment apparatus.

As the impurity element 221, for example, at least one element of a Group 13 element and a Group 15 element can be used. In the case where an oxide semiconductor is used for the semiconductor layer 208, it is possible to use at least one kind of element of a rare gas, hydrogen, and nitrogen as the impurity element 221.

A transistor 431 illustrated in FIG. 16A2 is different from the transistor 430 in that the electrode 213 and an insulating layer 217 are included. The transistor 431 includes the electrode 213 formed over the insulating layer 119 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 401 has large on-state current for the area occupied thereby. That is, the area occupied by the transistor 431 can be small for required on-state current. According to one embodiment of the present invention, the area occupied by a transistor can be reduced. Therefore, according to one embodiment of the present invention, a semiconductor device having a high degree of integration can be provided.

A transistor 440 shown in FIG. 16B1 as an example is a type of top-gate transistor. The transistor 440 is different from the transistor 430 in that the semiconductor layer 208 is formed after the formation of the electrode 214 and the electrode 215. A transistor 441 shown in FIG. 16B2 as an example is different from the transistor 440 in that it includes the electrode 213 and the insulating layer 217. Thus, in the transistors 440 and 441, part of the semiconductor layer 208 is formed over the electrode 214 and another part of the semiconductor layer 208 is formed over the electrode 215.

The transistor 441 as well as the transistor 401 has large on-state current for the area occupied thereby. That is, the area occupied by the transistor 441 can be small for required on-state current. According to one embodiment of the present invention, the area occupied by a transistor can be reduced. Therefore, according to one embodiment of the present invention, a semiconductor device having a high degree of integration can be provided.

In the transistors 440 and 441, after the formation of the electrode 206, the impurity element 221 is introduced into the semiconductor layer 208 using the electrode 206 as a mask, so that an impurity region can be formed in the semiconductor layer 208 in a self-aligned manner.

[S-Channel Transistor]

Figure 17C:
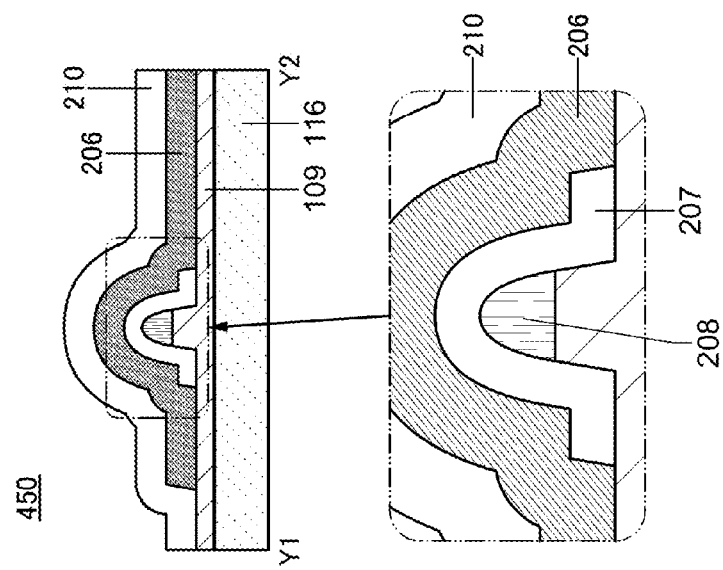
FIGS. 17A to 17C are a plan view and cross-sectional views illustrating one embodiment of a transistor.
Figure 17A:
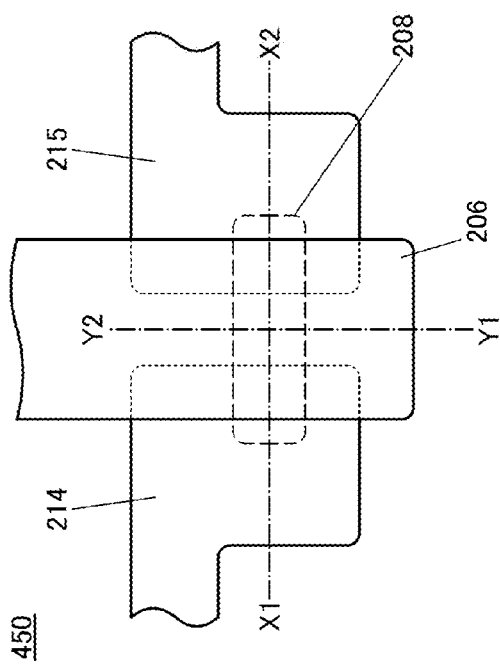
Figure 17B:
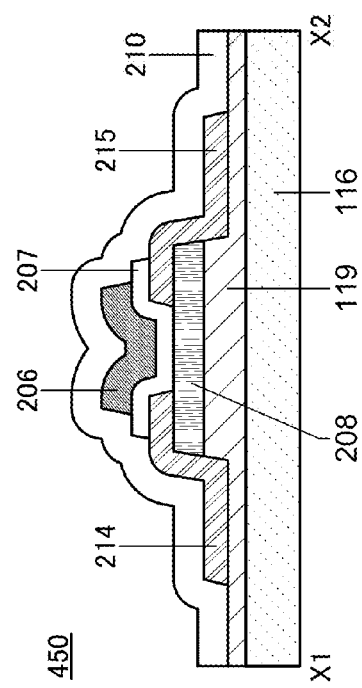

FIG. 17A is a top view of a transistor 450. FIG. 17B is a cross-sectional view (in the channel length direction) taken along the dashed-dotted line X1-X2 in FIG. 17A. FIG. 17C is a cross-sectional view (in the channel width direction) taken along the dashed-dotted line Y1-Y2 in FIG. 17A.

A semiconductor layer 208 is provided over a projecting portion of the insulating layer 119, in which case the electrode 206 can cover a side surface of the semiconductor layer 208. That is, the transistor 450 has a structure in which the semiconductor layer 208 is electrically surrounded by an electric field of the electrode 206. Such a structure of a transistor in which a semiconductor is electrically surrounded by an electric field of a conductive film is referred to as a surrounded channel (s-channel) structure. A transistor having an s-channel structure is referred to as an s-channel transistor.

In the s-channel transistor, a channel is formed in the whole (bulk) of the semiconductor layer 208 in some cases. In the s-channel transistor, the drain current of the transistor can be increased, so that a larger amount of on-state current can be obtained. Therefore, the area occupied by the transistor can be reduced, which leads to high definition of a display device and high integration of a semiconductor device.

Furthermore, the entire channel formation region of the semiconductor layer 208 can be depleted by the electric field of the electrode 206. Accordingly, the off-state current of the s-channel transistor can be further reduced. Therefore, power consumption of a display device and a semiconductor device can be reduced.

When the projecting portion of the insulating layer 119 is increased in height, and the channel width is shortened, the effects of the s-channel structure to increase the on-state current and reduce the off-state current can be enhanced.

Figure 18C:
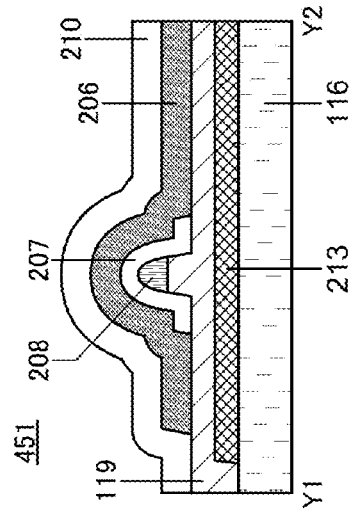
FIGS. 18A to 18C are a plan view and cross-sectional views illustrating one embodiment of a transistor.
Figure 18A:
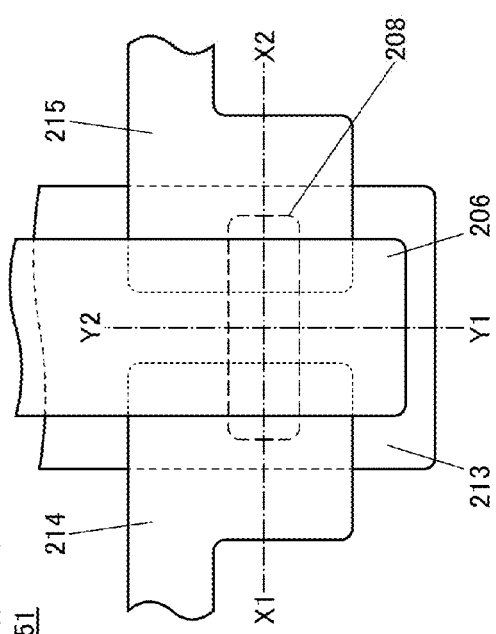
Figure 18B:
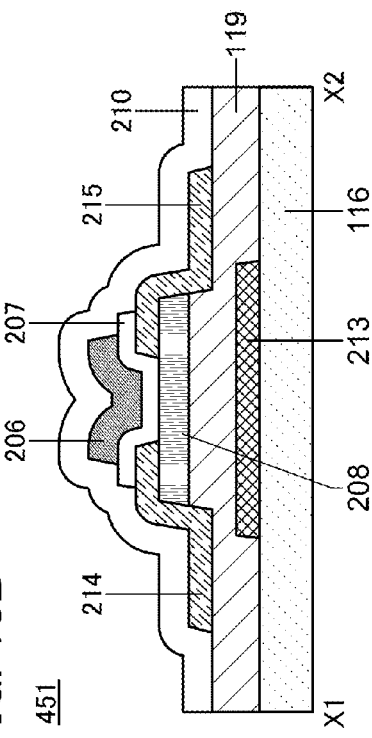

As in a transistor 451 illustrated in FIGS. 18A to 18C, the electrode 213 may be provided under the semiconductor layer 208 with an insulating layer positioned therebetween. FIG. 18A is a top view of a transistor 451. FIG. 18B is a cross-sectional view taken along the dashed-dotted line X1-X2 in FIG. 18A. FIG. 18C is a cross-sectional view taken along the dashed-dotted line Y1-Y2 in FIG. 18A.

<Structure of Oxide Semiconductor>

Here, a structure of an oxide semiconductor is described.

Oxide semiconductors are classified into single crystal oxide semiconductors and non-single-crystal oxide semiconductors. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

[CAAC-OS]

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 23A:
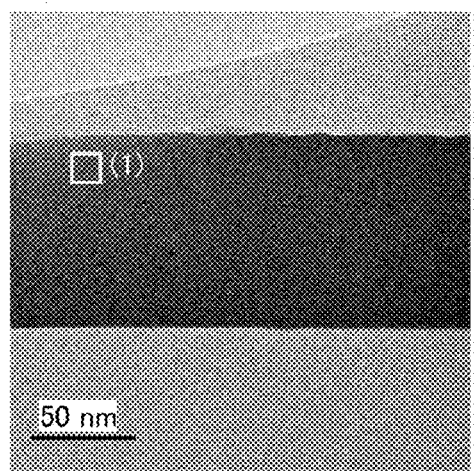
FIGS. 23A to 23D are Cs-corrected high-resolution TEM images of a cross section of a CAAC-OS and a cross-sectional schematic view of the CAAC-OS.

A CAAC-OS observed with TEM is described below. FIG. 23A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 23B:
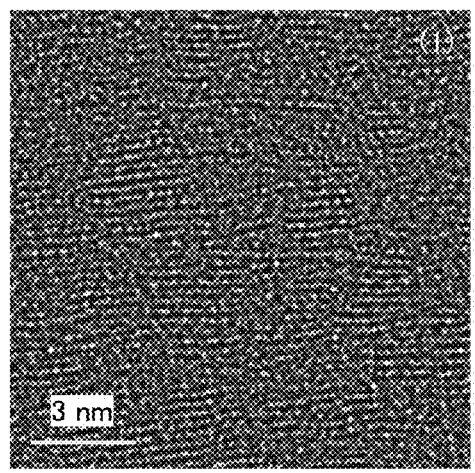

FIG. 23B is an enlarged Cs-corrected high-resolution TEM image of a region (1) in FIG. 23A. FIG. 23B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 23C:
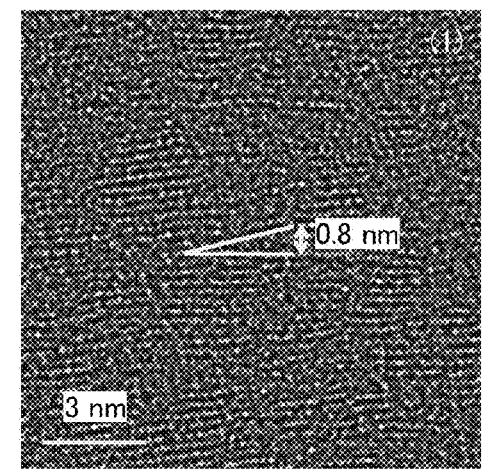

As shown in FIG. 23B, the CAAC-OS has a characteristic atomic arrangement. The characteristic atomic arrangement is denoted by an auxiliary line in FIG. 23C. FIGS. 23B and 23C prove that the size of a pellet is approximately 1 nm to 3 nm, and the size of a space caused by tilt of the pellets is approximately 0.8 nm. Therefore, the pellet can also be referred to as a nanocrystal (nc).

Figure 23D:
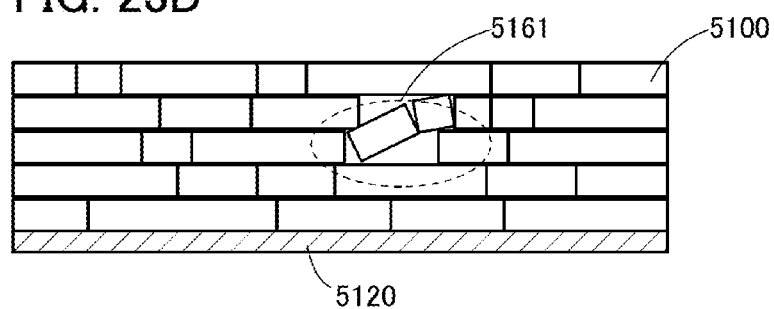

Here, according to the Cs-corrected high-resolution TEM images, the schematic arrangement of pellets 5100 of a CAAC-OS over a substrate 5120 is illustrated by such a structure in which bricks or blocks are stacked (see FIG. 23D). The part in which the pellets are tilted as observed in FIG. 23C corresponds to a region 5161 shown in FIG. 23D.

FIG. 24A shows a Cs-corrected high-resolution TEM image of a plane of the CAAC-OS observed from a direction substantially perpendicular to the sample surface. FIGS. 24B, 24C, and 24D are enlarged Cs-corrected high-resolution TEM images of regions (1), (2), and (3) in FIG. 24A, respectively. FIGS. 24B, 24C, and 24D indicate that metal atoms are arranged in a triangular, quadrangular, or hexagonal configuration in a pellet. However, there is no regularity of arrangement of metal atoms between different pellets.

Figure 25A:
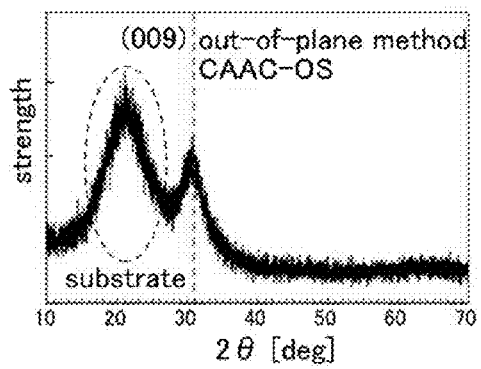
FIGS. 25A to 25C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 25A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 25B:
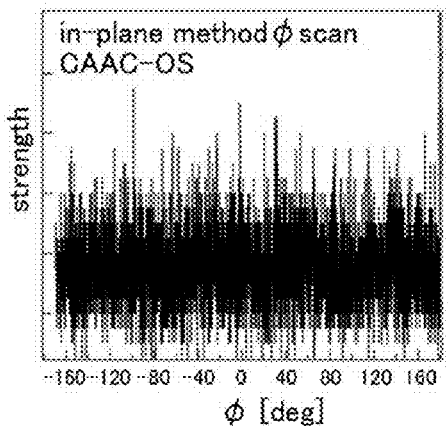
Figure 25C:
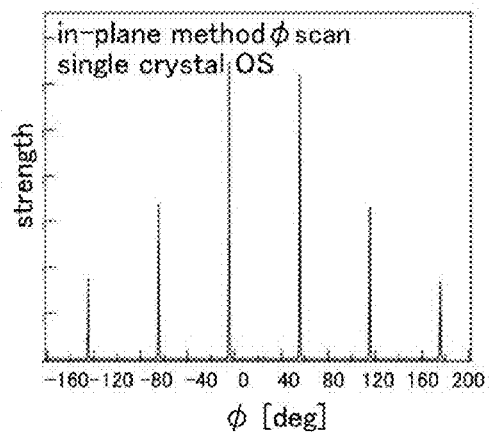

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 25B, a peak is not clearly observed. In contrast, in the case of a single crystal oxide semiconductor of InGaZnO$_4$, when φ scan is performed with 2θ fixed at around 56°, as shown in FIG. 25C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 26A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 26B shows a diffraction pattern obtained in such a manner that an electron beam with a probe diameter of 300 nm is incident on the same sample in a direction perpendicular to the sample surface. As shown in FIG. 26B, a ring-like diffraction pattern is observed. Thus, the electron diffraction also indicates that the a-axes and b-axes of the pellets included in the CAAC-OS do not have regular alignment. The first ring in FIG. 26B is considered to be derived from the (010) plane, the (100) plane, and the like of the InGaZnO$_4$ crystal. The second ring in FIG. 26B is considered to be derived from the (110) plane and the like.

The CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor might serve as carrier traps or carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor including the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor including a CAAC-OS, variation in electrical characteristics due to irradiation with visible light or ultraviolet light is small.

[Microcrystalline Oxide Semiconductor]

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

[Amorphous Oxide Semiconductor]

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

[Amorphous-Like Oxide Semiconductor]

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 27:
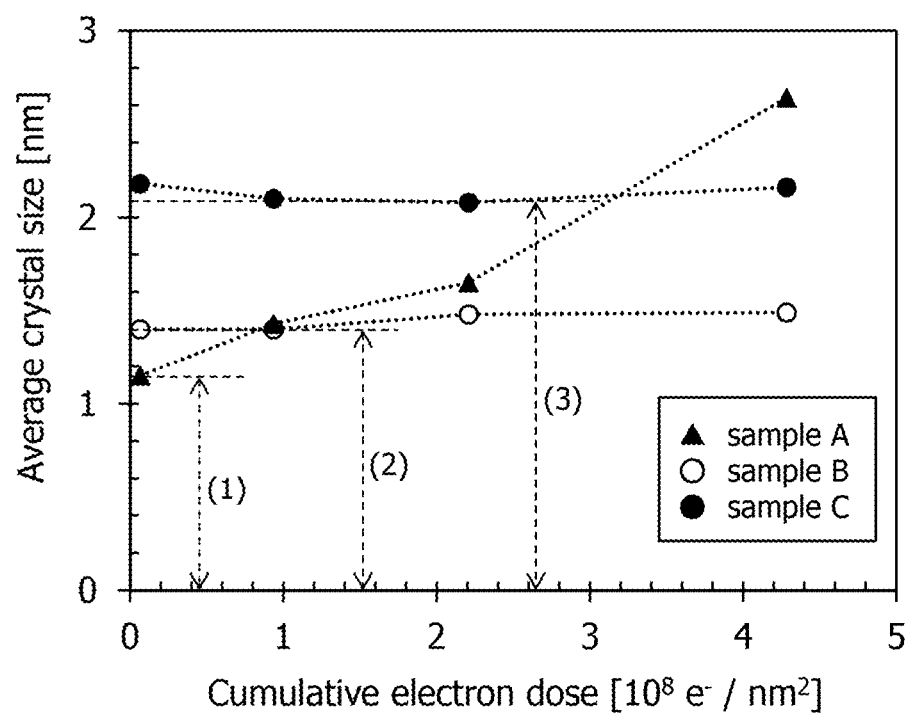
FIG. 27 shows a change in crystal part of an In—Ga—Zn oxide induced by electron irradiation.

FIG. 27 shows change in the average size of crystal parts (at 22 points to 45 points) in each sample. Note that the crystal part size corresponds to the length of a lattice fringe. FIG. 27 indicates that the crystal part size in the a-like OS increases with an increase in the cumulative electron dose. Specifically, as shown by (1) in FIG. 27, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 27, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more of an amorphous oxide semiconductor, an a-like OS, a microcrystalline oxide semiconductor, and a CAAC-OS, for example.

This embodiment can be implemented in an appropriate combination with any of the structures described in the other embodiments.

(Embodiment 5)

A touch panel can be made by a combination of a touch sensor and the display device 100 described in the above embodiments. Examples of the touch sensor combined with the display device 100 include, but not limited to, a capacitive touch sensor and a resistive touch sensor. Examples of the capacitive touch sensor are of a surface capacitive type and of a projected capacitive type. Alternatively, an active matrix touch sensor using an active element such as a transistor can be used.

In this embodiment, a structure and a driving method of an active matrix touch sensor 500 that can be used as the touch sensor 271 are described with reference to FIGS. 19A to 19D2 and FIGS. 20A to 20D.

FIG. 19A is a block diagram illustrating a structure of the active matrix touch sensor 500. FIG. 19B is a circuit diagram illustrating a structure of a converter CONV. FIG. 19C is a circuit diagram illustrating a structure of a sensing unit 510. FIGS. 19D1 and 19D2 are timing charts showing a method of driving the sensing unit 510.

Figure 20A:
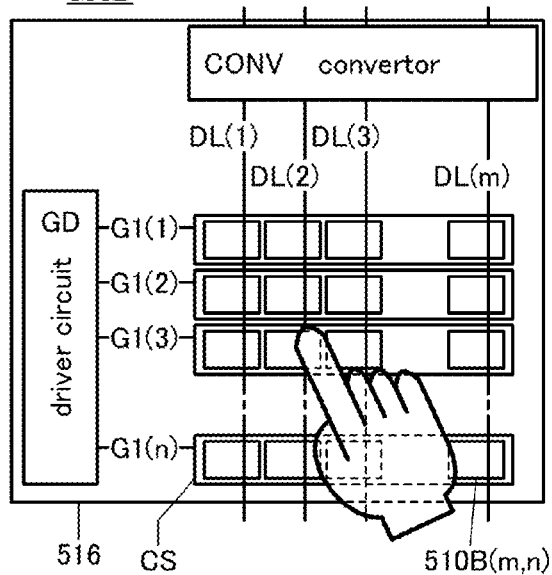
FIGS. 20A to 20D illustrate a structure example of a touch sensor and an example of a method for driving the touch sensor.
Figure 20B:
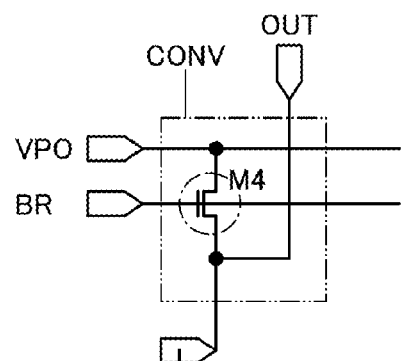
Figure 20C:
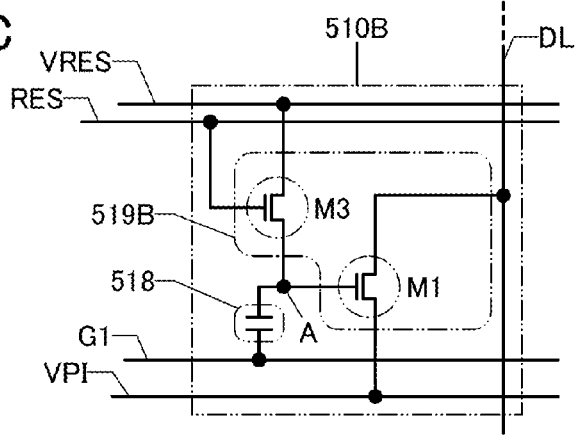
Figure 20D:
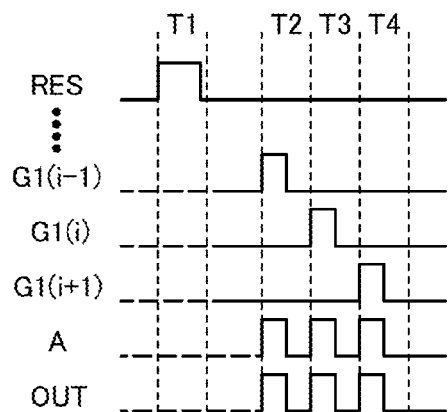

FIG. 20A is a block diagram illustrating a structure of an active matrix touch sensor 500B. FIG. 20B is a circuit diagram illustrating a structure of a converter CONV. FIG. 20C is a circuit diagram illustrating a structure of a sensing unit 510B. FIG. 20D is a timing chart showing a method of driving the sensing unit 510B.

<Structure Example 1 of Positional Data Input Portion>

The touch sensor 500 illustrated in FIGS. 19A to 19D2 includes the sensing units 510 arranged in a matrix; scan lines G1 to which the sensing units 510 arranged in the row direction are electrically connected; and signal lines DL to which the sensing units 510 arranged in the column direction are electrically connected (see FIG. 19A).

For example, the sensing units 510 can be arranged in a matrix of n rows and m columns (each of n and m is a natural number greater than or equal to 1).

The sensing unit 510 includes a sensor element 518 that functions as a capacitor and a sensor circuit 519. A first electrode of the sensor element 518 is electrically connected to a wiring CS. A second electrode of the sensor element 518 is electrically connected to a node A. With this structure, a potential of the node A can be controlled by a control signal supplied by the wiring CS.

<<Sensor Circuit 519>>

The sensor circuit 519 illustrated in FIG. 19C includes a transistor M1, a transistor M2, and a transistor M3. A gate of the transistor M1 is electrically connected to the node A. One of a source and a drain of the transistor M1 is electrically connected to a wiring VPI that can supply the ground potential. The other of the source and the drain is electrically connected to one of a source and a drain of the transistor M2.

The other of the source and the drain of the transistor M2 is electrically connected to the signal line DL that can supply a sensing signal DATA. A gate of the transistor M2 is electrically connected to a scan line G1 that can supply a selection signal.

Note that a low resistance material is preferably used for a conductive layer such as the signal line DL and the scan line G1, i.e., a wiring or an electrode, included in the touch sensor. For example, silver, copper, aluminum, a carbon nanotube, graphene, or a metal halide (such as a silver halide) may be used. Alternatively, a metal nanowire including a number of conductors with an extremely small width (for example, a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an A1 mesh. In the case of using an Ag nanowire, a light transmittance of 89% or more and a sheet resistance of 40 ohm/square or more and 100 ohm/square or less can be achieved. Since such a material provides a high light transmittance, the metal nanowire, the metal mesh, a carbon nanotube, graphene, or the like may be used for an electrode of the display element, such as a pixel electrode or a common electrode.

One of a source and a drain of the transistor M3 is electrically connected to the node A. The other of the source and the drain is electrically connected to a wiring VRES that can supply a potential that turns on the transistor M1. A gate of the transistor M3 is electrically connected to a wiring RES that can supply a reset signal.

The capacitance of the sensor element 518 varies, for example, when an object gets closer to the first electrode or the second electrode of the sensor element 518 (the node A) or when a gap between the first and second electrodes is changed. Thus, the sensing unit 510 can supply the sensing signal DATA in accordance with a change in the capacitance of the sensor element 518.

The wiring VRES and the wiring VPI can supply, for example, a ground potential. A wiring VPO and a wiring BR can supply, for example, a high power supply potential.

The wiring RES can supply a reset signal. The scan line G1 can supply a selection signal. The wiring CS can supply a control signal for controlling the potential of the second electrode (the potential of the node A) of the sensor element.

The signal line DL can supply the sensing signal DATA. A terminal OUT can supply a signal obtained by conversion based on the sensing signal DATA.

<<Converter CONV>>

The convertor CONV includes a conversion circuit. Any of various circuits that can convert the sensing signal DATA and supply a signal obtained by the conversion to the terminal OUT can be used for the converter CONV. The converter CONV may be electrically connected to the sensing circuit 519 to form a source follower circuit, a current mirror circuit, or the like, for example.

Specifically, a source follower circuit can be formed using the converter CONV including a transistor M4 (see FIG. 19B). Note that the transistor M4 may be formed in the same process as the transistors M1 to M3.

Any of the transistors described in the above embodiments can be used as the transistors M1 to M4. For example, a Group 14 element, a compound semiconductor, or an oxide semiconductor can be used for the semiconductor layer. Specifically, a silicon-containing semiconductor, a gallium arsenide-containing semiconductor, an indium-containing oxide semiconductor, or the like can be used.

The convertor CONV and a driver circuit GD may be provided on another substrate (e.g., a single-crystal semiconductor substrate or a polycrystalline semiconductor substrate) and electrically connected to the sensing unit 510 by a chip on glass (COG) method, a wire bonding method, or the like, or using an FPC or the like.

<Driving Method of Sensing Circuit 519>

The driving method of the sensing circuit 519 is described.

<<First Step>>

In a first step, a reset signal is supplied to the gate of the transistor M3, so that the potential of the node A is set at a predetermined potential (see Period T1 in FIG. 19D1).

Specifically, the reset signal for turning on the transistor M3 is supplied to the gate of the transistor M3 through the wiring RES. The transistor M3 to which the reset signal has been supplied is turned on and sets the potential of the node A to a potential at which the transistor M1 is turned off, for example (see Period T1 in FIG. 19D1).

<<Second Step>>

In a second step, a reset signal for turning off the transistor M3 is supplied to the gate of the transistor M3. In addition, a selection signal for turning on the transistor M2 is supplied to the gate of the transistor M2, so that the other of the source and the drain of the transistor M1 is electrically connected to the signal line DL.

Specifically, the selection signal for turning on the transistor M2 is supplied to the gate of the transistor M2 through the scan line G1. The transistor M2 to which the selection signal has been supplied is turned on and electrically connects the other of the source and the drain of the transistor M1 to the signal line DL (see Period T2 in FIG. 19D1).

<<Third Step>>

In a third step, a control signal is supplied to the first electrode of the sensor element 518, and a control signal and the potential that varies depending on the electrostatic capacitance of the sensor element 518 are supplied to the gate of the transistor M1 via the node A.

Specifically, a rectangular control signal is supplied to the wiring CS. The sensor element 518 the first electrode of which is supplied with the rectangular control signal increases the potential of the node A in accordance with the electrostatic capacitance of the sensor element 518 (see the latter part of Period T2 in FIG. 19D1).

For example, when the sensor element 518 is placed in the air and an object having a higher dielectric constant than the air is placed in the proximity of the first electrode of the sensor element 518, the apparent electrostatic capacitance of the sensor element 518 is increased. In this case, a change in the potential of the node A caused by the rectangular control signal is smaller than that when an object having a higher dielectric constant than the air is not placed in the proximity of the first electrode of the sensor element 518 (see a solid line in FIG. 19D2).

<<Fourth Step>>

In a fourth step, a signal caused by a change in the potential of the gate of the transistor M1 is supplied to the signal line DL.

For example, a change in current caused by a change in the potential of the gate of the transistor M1 is supplied to the signal line DL.

The converter CONV converts a change in current flowing through the signal line DL into a voltage change and supplies the voltage change to the terminal OUT.

<<Fifth Step>>

In a fifth step, a selection signal for turning off the transistor M2 is supplied to the gate of the transistor M2.

Each of the scan lines G1(1) to G1(n) performs the first to fifth steps; thus, which region in the touch sensor 500 is selected can be sensed.

<Structure Example 2 of Positional Data Input Portion>

The touch sensor 500B illustrated in FIGS. 20A to 20D is different from the touch sensor 500 in that the touch sensor 500B includes the sensing unit 510B instead of the sensing unit 510.

The sensing unit 510B is different from the sensing unit 510 in the following points: the first electrode of the sensor element 518 in the sensing unit 510B is electrically connected to the scan line G1 while that in the sensing unit 510 is electrically connected to the wiring CS; and the other of the source and the drain of the transistor M1 in the sensing unit 510B is electrically connected to the signal line DL not via the transistor M2 while that in the sensing unit 510 is electrically connected to the signal line DL via the transistor M2. Here, different structures are described in detail, and the above description is referred to for the other similar structures.

The touch sensor 500B includes the sensing units 510B arranged in a matrix; scan lines G1 to which the sensing units 510B arranged in the row direction are electrically connected; and signal lines DL to which the sensing units 510B arranged in the column direction are electrically connected (see FIG. 20A).

For example, the sensing units 510B can be arranged in a matrix of n rows and m columns (each of n and m is a natural number greater than or equal to 1).

The sensing unit 510B includes the sensor element 518, and the first electrode of the sensor element 518 is electrically connected to the scan line G1. With this structure, a selected scan line G1 can control the potentials of the nodes A of the sensing units 510B to which the selected scan line G1 is electrically connected, by supplying the selection signal.

The signal line DL and the scan line G1 may be formed with the same conductive film.

The first electrode of the sensor element 518 and the scan line G1 may be formed with the same conductive film. For example, the first electrodes of the sensor elements 518 included in the sensing units 510B arranged in the row direction may be connected and the connected electrodes may be used as the scan line G1.

<<Sensor Circuit 519B>>

The sensor circuit 519B illustrated in FIG. 20C includes the transistor M1 and the transistor M3. A gate of the transistor M1 is electrically connected to the node A. One of a source and a drain of the transistor M1 is electrically connected to a wiring VPI that can supply the ground potential. The other of the source and the drain is electrically connected to the signal line DL that can supply the sensing signal DATA.

One of the source and the drain of the transistor M3 is electrically connected to the node A. The other of the source and the drain is electrically connected to the wiring VRES that can supply a potential that turns on the transistor M1. The gate of the transistor M3 is electrically connected to the wiring RES that can supply a reset signal.

The capacitance of the sensor element 518 varies, for example, when an object gets closer to the first electrode or the second electrode of the sensor element 518 (the node A) or when a gap between the first and second electrodes is changed. Thus, the sensing unit 510 can supply the sensing signal DATA in accordance with a change in the capacitance of the sensor element 518.

The wiring VRES and the wiring VPI can supply, for example, a ground potential. A wiring VPO and a wiring BR can supply, for example, a high power supply potential.

The wiring RES can supply the reset signal, and the scan line G1 can supply the selection signal.

The signal line DL can supply the sensing signal DATA. The terminal OUT can supply a signal obtained by conversion based on the sensing signal DATA.

<Driving Method of Sensing Circuit 519B>

The driving method of the sensing circuit 519B is described.

<<First Step>>

In a first step, a reset signal is supplied to the gate of the transistor M3, so that the potential of the node A is set at a predetermined potential (see Period T1 in FIG. 20D).

Specifically, the reset signal for turning on the transistor M3 is supplied to the gate of the transistor M3 through the wiring RES. The transistor M3 to which the reset signal has been supplied is turned on and sets the potential of the node A to a potential at which the transistor M1 is turned off, for example (see FIG. 20C).

<<Second Step>>

In a second step, a reset signal for turning off the transistor M3 is supplied to the gate of the transistor M3. In addition, a selection signal is supplied to a first electrode of the sensor element 518, and a potential that varies depending on the selection signal and the electrostatic capacitance of the sensor element 518 is supplied to the gate of the transistor M1 via the node A (see Period T2 in FIG. 20D).

Specifically, a rectangular selection signal is supplied to the scan line G1(i-1). The sensor element 518 the first electrode of which is supplied with the rectangular selection signal increases the potential of the node A in accordance with the electrostatic capacitance of the sensor element 518.

For example, when the sensor element 518 is placed in the air and an object having a higher dielectric constant than the air is placed in the proximity of the first electrode of the sensor element 518, the apparent electrostatic capacitance of the sensor element 518 is increased. In this case, a change in the potential of the node A caused by the rectangular selection signal is smaller than that when an object having a higher dielectric constant than the air is not placed in the proximity of the first electrode of the sensor element 518.

<<Third Step>>

In a third step, a signal caused by a change in the potential of the gate of the transistor M1 is supplied to the signal line DL.

For example, a change in current caused by a change in the potential of the gate of the transistor M1 is supplied to the signal line DL.

The converter CONV converts a change in current flowing through the signal line DL into a voltage change and supplies the voltage change to the terminal OUT.

Each of the scan lines G1(1) to G1(n) performs the first to third steps (see Periods T2 to T4 in FIG. 20D). In FIG. 20D, the scan line G1 in the i-th row (i is a natural number of 1 to n) is expressed as the scan line G1(i). According to the above-described structural and operation examples, which region in the touch sensor 500B is selected can be sensed.

In the active matrix touch sensor, signal supply to the sensing unit 510 that is not needed for sensing can be stopped by a transistor. This can reduce interference to a selected sensing unit 510 by a non-selected sensing unit 510. Accordingly, the active matrix touch sensor can have high resistance to noise and high detection sensitivity.

Since the active matrix touch sensor can have high detection sensitivity, even when the sensing unit 510 or the sensor element 518 is reduced in size, a selected region can be detected with high accuracy. Therefore, in the active matrix touch sensor, the number of sensing units 510 per unit area (surface density) can be increased. Thus, the active matrix touch sensor can have high accuracy of detecting the position of a selected region.

The active matrix touch sensor can be a touch sensor of various sizes, for example, a hand-held touch sensor or a touch sensor that can be used in an electronic blackboard. In particular, the entire detection region in the active matrix touch sensor can be increased easily as compared with the other touch sensors. The use of the active matrix touch sensor enables a large-area touch panel with high resolution.

This embodiment can be implemented in an appropriate combination with any of the structures described in the other embodiments.

(Embodiment 6)

In this embodiment, structure examples of a light-emitting element that can be applied to the light-emitting element 125 are described using a light-emitting element 330 and a light-emitting element 331.

<Structure Example of Light-Emitting Element>

Figure 21A:
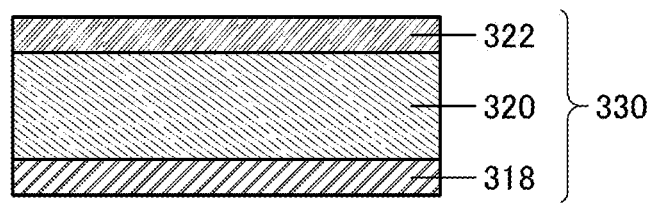
FIGS. 21A and 21B illustrate structure examples of light-emitting elements.

In a light-emitting element 330 illustrated in FIG. 21A, the EL layer 320 is interposed between a pair of electrodes (an electrode 318 and an electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element 330 illustrated in FIG. 21A emits light when current flows because of a potential difference applied between the electrode 318 and the electrode 322 and holes and electrons are recombined in the EL layer 320. That is, the light-emitting region is formed in the EL layer 320.

In the present invention, light emitted from the light-emitting element 330 is extracted to the outside from the electrode 318 side or the electrode 322 side. Therefore, one of the electrode 318 and the electrode 322 is formed of a light-transmitting substance.

Figure 21B:
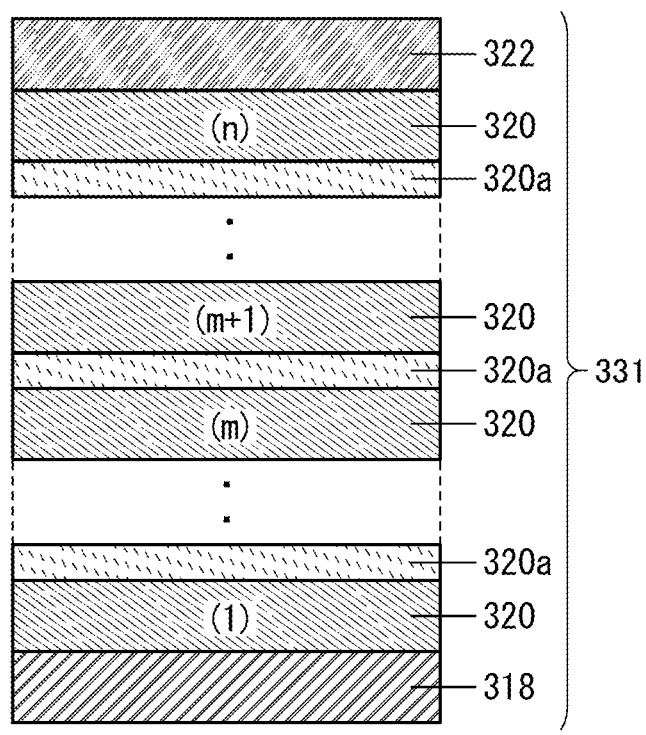

Note that a plurality of EL layers 320 may be stacked between the electrode 318 and the electrode 322 as in a light-emitting element 331 illustrated in FIG. 21B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n.

The charge-generation layer 320a can be formed using a composite material of an organic compound and a metal oxide. Examples of the metal oxide are vanadium oxide, molybdenum oxide, and tungsten oxide. As the organic compound, a variety of compounds can be used; for example, an aromatic amine compound, a carbazole derivative, an aromatic hydrocarbon, and an oligomer, a dendrimer, and a polymer which have a basic skeleton of these compounds can be used. Note that the organic compound having a hole mobility of $10^{-6}$ cm$^2$/Vs or greater is preferably used as an organic compound having a hole-transport property. However, other substances may be used as long as their hole-transport properties are higher than their electron-transport properties. These materials used for the charge generation layer 320a have excellent carrier-injection properties and carrier-transport properties; thus, the light-emitting element 330 can be driven with low current and with low voltage. Other than the composite material, the metal oxide, a composite material of an organic compound and an alkali metal, an alkaline earth metal, or a compound of the alkali metal or the alkaline earth metal can be used in the charge-generation layer 320a.

Note that the charge generation layer 320a may be formed with a combination of a composite material of an organic compound and a metal oxide with another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

The light-emitting element 331 having such a structure is unlikely to suffer the problem of energy transfer between the neighboring EL layers 320, and thus can easily have both high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied between the electrode 318 and the electrode 322.

The light-emitting element 331 illustrated in FIG. 21B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light emission can be obtained.

In the case of obtaining white light emission using the light-emitting element 331 illustrated in FIG. 21B, as for the combination of a plurality of EL layers, a structure for emitting white light including red light, green light, and blue light may be used; for example, the structure may include an EL layer containing a blue fluorescent substance as a light-emitting substance and an EL layer containing red and green phosphorescent substances as light-emitting substances. Alternatively, a structure including an EL layer emitting red light, an EL layer emitting green light, and an EL layer emitting blue light may be employed. Further alternatively, with a structure including EL layers emitting light of complementary colors, white light emission can be obtained. In a stacked-layer element including two EL layers in which light emitted from one of the light-emitting layers and light emitted from the other light-emitting layer have complementary colors to each other, the combinations of colors are as follows: blue and yellow, blue-green and red, and the like.

Note that in the structure of the above-described stacked-layer element, by providing the charge generation layer between the stacked light-emitting layers, the element can have a long lifetime in a high-luminance region while keeping the current density low.

This embodiment can be implemented in an appropriate combination with any of the structures described in the other embodiments.

(Embodiment 7)

In this embodiment, examples of an electronic device including the display device of one embodiment of the present invention are described with reference to drawings.

Specific examples of the electronic device that uses the display device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large-sized game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

In particular, as examples of electronic devices including the display device of one embodiment of the present invention, the following can be given: television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 22A:
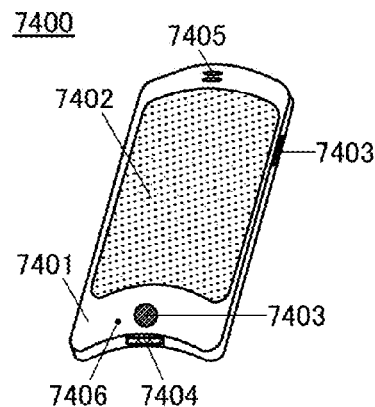
FIGS. 22A to 22E illustrate examples of electronic devices.

FIG. 22A is an example of a mobile phone (e.g., a smartphone). A mobile phone 7400 includes a display portion 7402 that is incorporated in a housing 7401. The mobile phone 7400 further includes operation buttons 7403, an external connection port 7404, a speaker 7405, a microphone 7406, and the like. The mobile phone 7400 is manufactured using the display device of one embodiment of the present invention for the display portion 7402.

The mobile phone 7400 illustrated in FIG. 22A includes a touch sensor in the display portion 7402. When the display portion 7402 is touched with a finger or the like, data can be input into the mobile phone 7400. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device of one embodiment of the present invention. Thus, the mobile phone consumes low power and can have high reliability.

Figure 22B:
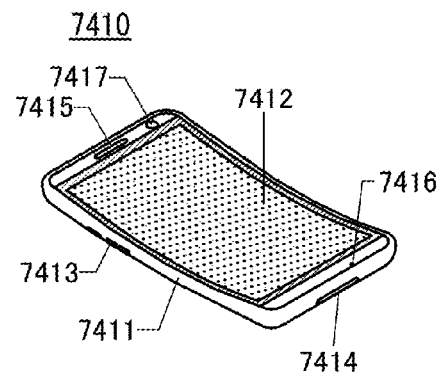

FIG. 22B illustrates an example of a mobile phone (including a smartphone). A mobile phone 7410 includes a housing 7411 provided with a display portion 7412, a microphone 7416, a speaker 7415, a camera 7417, an external connection portion 7414, an operation button 7413, and the like. The display device of one embodiment of the present invention formed using a flexible substrate can be used for the display portion 7412 with a curved surface.

When the display portion 7412 of the cellular phone 7410 illustrated in FIG. 22B is touched with a finger or the like, data can be input to the cellular phone 7410. Operations such as making a call and creating an e-mail can be performed by touching the display portion 7412 with a finger or the like.

There are mainly three screen modes of the display portion 7412. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7412 so that characters displayed on the screen can be input. In this case, it is preferable to display a keyboard or number buttons on almost the entire screen of the display portion 7412.

The screen modes can be switched depending on the kind of images displayed on the display portion 7412. For example, when a signal of an image displayed on the display portion is a signal of moving image data, the screen mode may be switched to the display mode. When the signal is a signal of text data, the screen mode may be switched to the input mode.

In the input mode, if a touch sensor in the display portion 7412 judges that the input by touch on the display portion 7412 is not performed for a certain period, the screen mode may be switched from the input mode to the display mode.

When a detection device including a sensor (e.g., a gyroscope or an acceleration sensor) is provided inside the mobile phone 7410, the direction of display on the screen of the display portion 7412 can be automatically changed by determining the orientation of the mobile phone 7410 (whether the mobile phone is placed horizontally or vertically). Furthermore, the direction of display on the screen can be changed by touch on the display portion 7412 or operation with the operation button 7413 of the housing 7411.

Figure 22C:
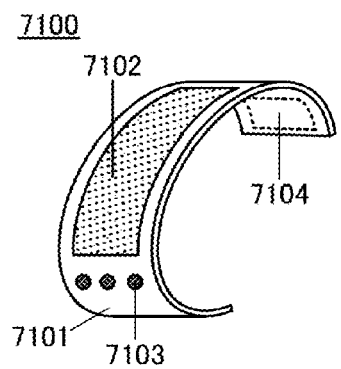

FIG. 22C is an example of a wristband-type display device. A portable display device 7100 includes a housing 7101, a display portion 7102, operation buttons 7103, and a transceiver 7104.

The portable display device 7100 can receive a video signal with the transceiver 7104 and can display the received video on the display portion 7102. In addition, with the transceiver 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Therefore, the portable display device consumes low power and can have high reliability.

Figure 22D:
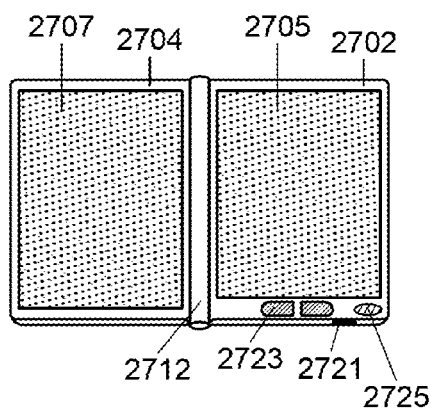

FIG. 22D illustrates an example of an e-book reader. For example, the e-book reader includes two housings, a housing 2702 and a housing 2704. The housing 2702 and the housing 2704 are combined with a hinge 2712 so that the e-book reader can be opened and closed with the hinge 2712 as an axis. With such a structure, the e-book reader can operate like a paper book.

A display portion 2705 and a display portion 2707 are incorporated in the housing 2702 and the housing 2704, respectively. The display portion 2705 and the display portion 2707 may display one image or different images. In the structure where different images are displayed on different display portions, for example, the right display portion (the display portion 2705 in FIG. 22D) can display text and the left display portion (the display portion 2707 in FIG. 22D) can display images. By using the display device described in the above embodiments, the e-book reader consumes low power and can have high reliability FIG. 22D illustrates an example in which the housing 2702 is provided with an operation portion and the like. For example, the housing 2702 is provided with a power supply terminal 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may be configured to transmit and receive data wirelessly. Through wireless communication, desired book data or the like can be purchased and downloaded from an e-book server.

Figure 22E:
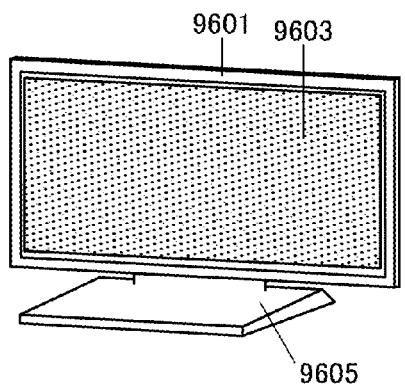

FIG. 22E illustrates an example of a television set. In a television set, a display portion 9603 is incorporated in a housing 9601. The display portion 9603 can display images. Here, the housing 9601 is supported by a stand 9605. By applying the display device described in any of the above embodiments, the television set consumes low power and can have high reliability.

The television set can be operated by an operation switch of the housing 9601 or a separate remote controller. Further, the remote controller may be provided with a display portion for displaying data output from the remote controller.

Note that the television set is provided with a receiver, a modem, and the like. With use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in an appropriate combination with any of the structures described in the other embodiments.

This application is based on Japanese Patent Application serial no. 2014-180856 filed with Japan Patent Office on Sep. 5, 2014 and Japanese Patent Application serial no. 2014-190964 filed with Japan Patent Office on Sep. 19, 2014, the entire contents of which are hereby incorporated by reference.

What is claimed is:

1. A display device comprising:
   a receiving circuit comprising an operational amplifier; and
   a display portion,
   wherein the display portion is configured to display an image at a frame frequency of less than or equal to 1 Hz in a still image display period, and
   wherein the receiving circuit is configured to stop supply of a bias current to the operational amplifier in the still image display period.

2. The display device according to claim 1, further comprising a driver circuit, wherein the driver circuit is electrically connected to the display portion.

3. The display device according to claim 2,
   wherein the driver circuit is configured to stop operation in the still image display period.

4. The display device according to claim 2,
   wherein the display device is configured to stop supply of a clock signal to the driver circuit in the still image display period.

5. The display device according to claim 1, wherein the display portion comprises a transistor and a display element.

6. The display device according to claim 5, wherein the transistor comprises an oxide semiconductor.

7. The display device according to claim 1, wherein the frame frequency is less than or equal to 0.2 Hz.

8. An electronic device comprising:
   the display device according to claim 1; and
   at least one of a touch sensor, an operation switch, a microphone, and a speaker.

9. A display device comprising:
   a first circuit comprising an operational amplifier; and
   a display portion,
   wherein the display portion is configured to display a still image in a first period, and display a moving image in a second period,
   wherein the display portion is configured to display an image at a frame frequency of less than or equal to 1 Hz in the first period, and
   wherein the first circuit is configured to stop supply of a bias current to the operational amplifier in the first period.

10. The display device according to claim 9, wherein the first period and the second period are configured to be switched by a control signal.

11. The display device according to claim 9, wherein the display portion comprises a transistor and a display element.

12. The display device according to claim 11, wherein the transistor comprises an oxide semiconductor.

13. The display device according to claim 9, wherein the frame frequency is less than or equal to 0.2 Hz.

14. An electronic device comprising:
    the display device according to claim 9; and
    at least one of a touch sensor, an operation switch, a microphone, and a speaker.

* * * * *